(12) United States Patent
Goward et al.

(10) Patent No.: US 11,972,895 B1
(45) Date of Patent: Apr. 30, 2024

(54) APPARATUS, SYSTEM, AND METHOD FOR STEPPING UP HIGH VOLTAGES WITHIN SMALL FORM FACTORS VIA OPTICAL COUPLINGS INCLUDING AN ARRAY OF PHOTOVOLTAIC CELLS OPTICALLY COUPLED TO PARALLELY CONNECTED LIGHT EMITTING DEVICES VIA A TRANSFER MEDIUM

(71) Applicant: META PLATFORMS TECHNOLOGIES, LLC, Menlo Park, CA (US)

(72) Inventors: John Goward, Redmond, WA (US); Maik Andre Scheller, Redmond, WA (US); Anurag Tyagi, Kirkland, WA (US); Jonathan Robert Peterson, Woodinville, WA (US); Christopher Yuan Ting Liao, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 677 days.

(21) Appl. No.: 17/139,742

(22) Filed: Dec. 31, 2020

(51) Int. Cl.
| | |
|---|---|
| *H02J 50/30* | (2016.01) |
| *G02B 27/01* | (2006.01) |
| *H01F 27/40* | (2006.01) |
| *H01F 27/42* | (2006.01) |
| *H01L 31/16* | (2006.01) |
| *H01L 31/054* | (2014.01) |
| *H10K 50/00* | (2023.01) |

(52) U.S. Cl.
CPC ....... *H01F 27/425* (2013.01); *G02B 27/0172* (2013.01); *H01F 27/40* (2013.01); *H01L 31/162* (2013.01); *H02J 50/30* (2016.02); *H01L 31/0543* (2014.12); *H02J 2300/24* (2020.01); *H10K 50/00* (2023.02)

(58) Field of Classification Search
CPC ......... Y02E 10/40; Y02E 10/50; Y02E 10/56; H02J 50/30; H02J 50/00; H02J 15/00; H01L 31/04; H02S 10/00; H02S 20/00; G02B 27/017; H01F 27/425
USPC .......................................... 250/203.4, 214 R
See application file for complete search history.

(56) References Cited

U.S. PATENT DOCUMENTS

| | | | | |
|---|---|---|---|---|
| 4,804,866 A | * | 2/1989 | Akiyama | .............. H01L 31/167 257/E31.108 |
| 9,130,401 B2 | * | 9/2015 | Adest | ............... H01L 31/02021 |

\* cited by examiner

*Primary Examiner* — Que Tan Le
(74) *Attorney, Agent, or Firm* — Greenberg Traurig, LLP

(57) ABSTRACT

A high-voltage optical transformer may include (1) an array of light-emitting devices that are connected in parallel with one another and are electrically coupled to an electrical input, (2) a transfer medium, and (3) an array of photovoltaic cells that (A) are optically coupled to the array of light-emitting devices via the transfer medium, (B) are connected in series with one another, and (C) produce an electrical output whose voltage is higher than the electrical input. Various other apparatuses, systems, and methods are also disclosed.

20 Claims, 17 Drawing Sheets

1000

```
                    ┌─────────┐
                    │  Start  │
                    └─────────┘
                         │
                         ▼
┌──────────────────────────────────────────────────────────────────────────┐
│ Manufacture a low-voltage die that includes an array of light-emitting    │
│ devices that are connected in parallel with one another and are           │
│ configured to be powered via an electrical input                          │
│                               1010                                        │
└──────────────────────────────────────────────────────────────────────────┘
                         │
                         ▼
┌──────────────────────────────────────────────────────────────────────────┐
│ Manufacture a high-voltage die that includes an array of photovoltaic     │
│ cells that are connected in series with one another and are configured    │
│ to produce an electrical output whose voltage is higher than the          │
│ electrical input                                                          │
│                               1020                                        │
└──────────────────────────────────────────────────────────────────────────┘
                         │
                         ▼
┌──────────────────────────────────────────────────────────────────────────┐
│ Form a high-voltage optical transformer with the low-voltage die and the  │
│ high-voltage die by bonding a transfer medium between the low-voltage     │
│ die and the high-voltage die and optically coupling the array of          │
│ light-emitting devices to the array of photovoltaic cells via the         │
│ transfer medium                                                           │
│                               1030                                        │
└──────────────────────────────────────────────────────────────────────────┘
                         │
                         ▼
                    ┌─────────┐
                    │   End   │
                    └─────────┘
```

FIG. 10

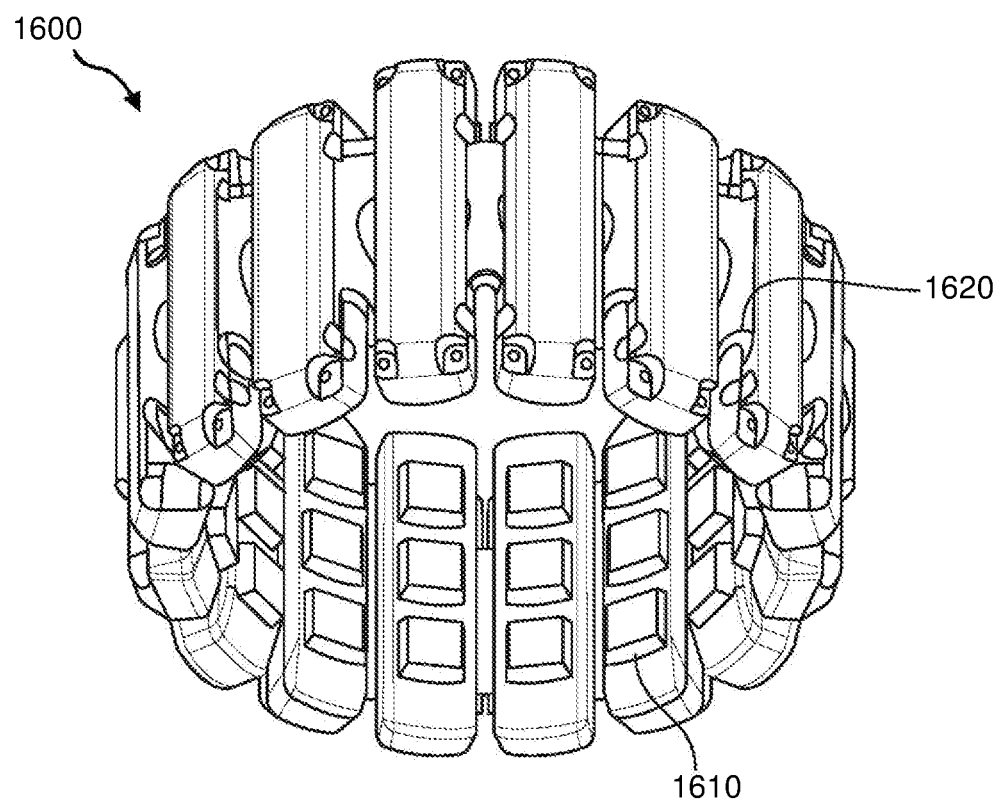
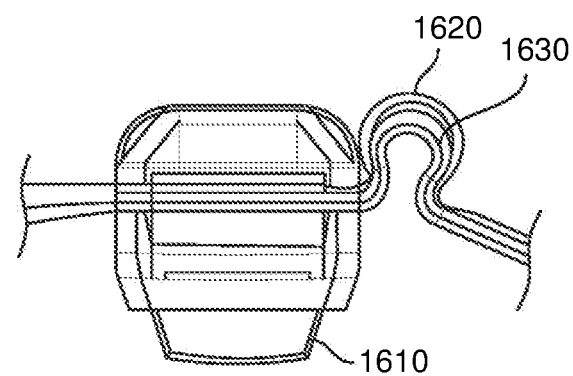
*FIG. 16*

APPARATUS, SYSTEM, AND METHOD FOR STEPPING UP HIGH VOLTAGES WITHIN SMALL FORM FACTORS VIA OPTICAL COUPLINGS INCLUDING AN ARRAY OF PHOTOVOLTAIC CELLS OPTICALLY COUPLED TO PARALLELY CONNECTED LIGHT EMITTING DEVICES VIA A TRANSFER MEDIUM

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 10 is a flow diagram of an exemplary method for stepping up high voltages within small form factors via optical couplings.

FIG. 16 is an illustration of an exemplary human-machine interface configured to be worn around a user's lower arm or wrist.

Figure 1:
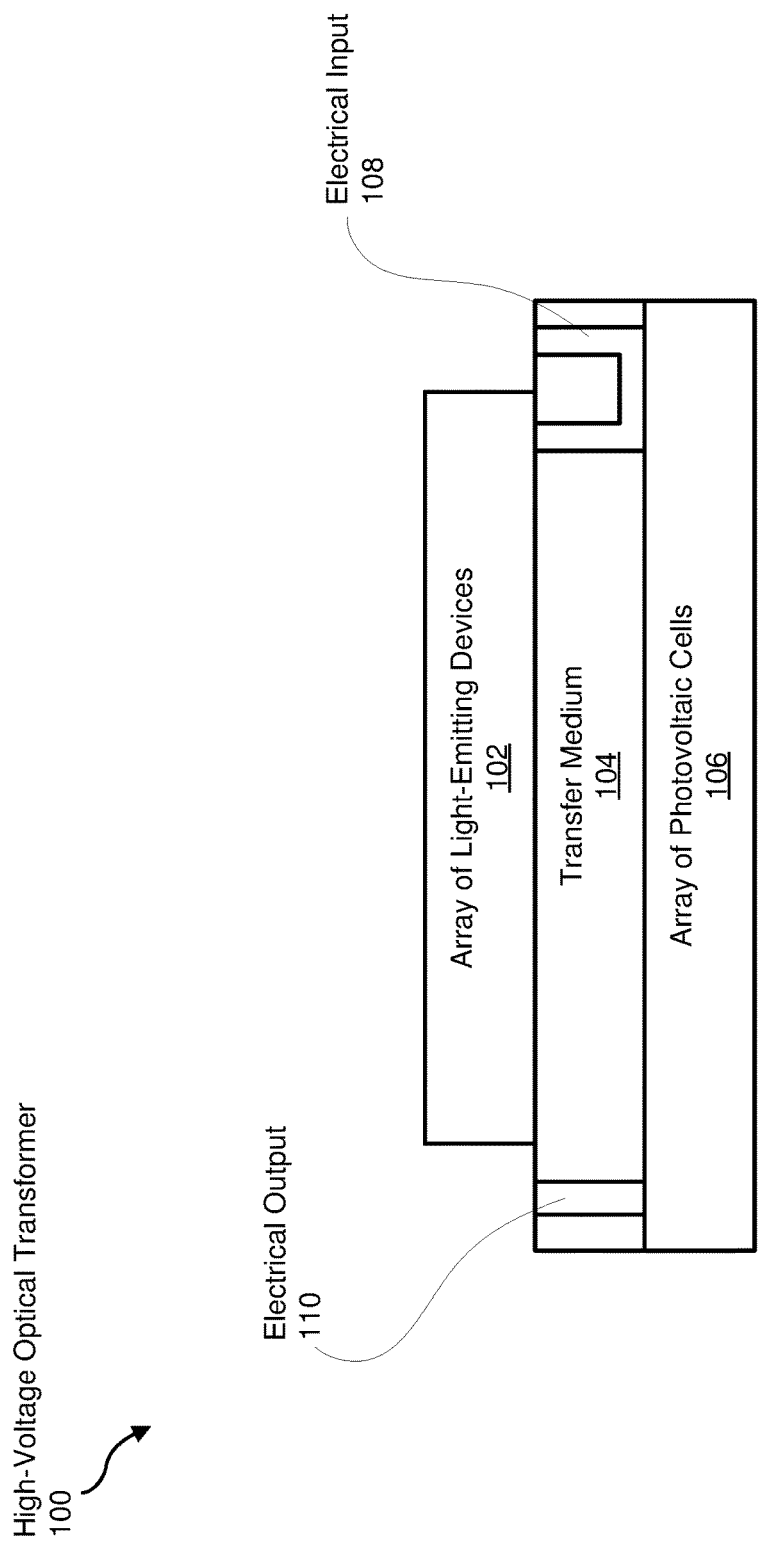
FIG. 1 is a block diagram of an exemplary high-voltage optical transformer for stepping up high voltages within small form factors via optical couplings in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

High-voltage transformers may be used to transform and/or convert isolated electrical inputs into different electrical outputs. In one example, a traditional high-voltage transformer may be able to step up voltages via an electromagnetic coupling by converting electrical energy at a primary coil into magnetic energy and then converting that magnetic energy back into electrical energy at a secondary coil. To achieve this conversion and provide the necessary degree of electrical isolation between the primary and secondary coils, the traditional high-voltage transformer may rely on and/or implement inductors and capacitors that consume a significant amount of space and/or real estate. The size of such inductors and capacitors may render the traditional high-voltage transformer bulky and/or unwieldy, thereby potentially limiting its applications (in, e.g., tight spaces) due to size constraints. Accordingly, the traditional high-voltage transformer may represent and/or necessitate a fairly large physical footprint.

The instant disclosure, therefore, identifies and addresses a need for improved apparatuses, systems, and methods for stepping up high voltages within small form factors via optical couplings. In some examples, the apparatuses, systems, and methods disclosed herein may implement, represent, and/or incorporate a step-up optical DC/DC transformer. For example, a step-up optical DC/DC transformer may include and/or form an optical coupling between a low-voltage component and a high-voltage component. In this example, the low-voltage component of the step-up optical DC/DC transformer may include and/or represent an array of light-emitting devices, and the high-voltage component of the step-up optical DC/DC transformer may include and/or represent an array of photovoltaic cells that are optically coupled to the array of light-emitting devices.

Continuing with this example, the low-voltage component may receive a low-voltage DC electrical input (e.g., 2 volts DC) that powers the array of light-emitting devices, which converts the low-vintage DC electrical input to light energy. As the array of photovoltaic cells are optically coupled to the array of light-emitting devices, the light energy may transfer from the array of light-emitting devices to the array of photovoltaic cells. Upon receiving the light energy from the array of light-emitting devices, the array of photovoltaic cells may convert the light energy into a high-voltage DC electrical output (e.g., 100 volts DC, 1000 volts DC, or more) capable of powering and/or charging a high-voltage device (such as a liquid lens device, a piezo actuator, a haptics device, etc.). Accordingly, the low-voltage component and the high-voltage component may be optically coupled to form a step-up optical transformer that converts electrical energy at the array of light-emitting devices into light energy and then converts that light energy back into electrical energy with a higher voltage level at the array of photovoltaic cells.

In some examples, optical couplings may be formed by and/or with a combination of light-emitting devices and photovoltaic cells, whereas traditional electromagnetic couplings may be formed by and/or with an electromagnetic transformer core and/or conductive windings. The combination of light-emitting devices and photovoltaic cells may be significantly smaller and/or more compact than the equivalent electromagnetic transformer core and/or conductive windings. Moreover, the combination of light-emitting devices and photovoltaic cells may cost less than the equivalent electromagnetic transformer core and/or conductive windings. As a result, the step-up optical DC/DC transformers disclosed herein may be able to optically transform and/or convert DC inputs into stepped-up DC outputs while consuming less space and/or costing less than traditional electromagnetic transformers. These step-up optical DC/DC transformers may, therefore, represent an improvement and/or advantage over the bulkiness, unwieldiness, and/or costliness of traditional electromagnetic transformers.

The following will provide, with reference to FIGS. 1-8, detailed descriptions of various apparatuses, systems, components, and/or implementations capable of stepping up high voltages within small form factors via optical couplings. The discussion corresponding to FIG. 9 will provide detailed descriptions of an exemplary method for stepping up high voltages within small form factors via optical couplings. The discussion corresponding to FIGS. 10-17 will provide detailed descriptions of types of exemplary artificial-reality devices, wearables, and/or associated systems that may incorporate and/or implement high-voltage optical transformers to facilitate and/or contribute to users' artificial reality experiences.

FIG. 1 is a block diagram of an exemplary high-voltage optical transformer 100 capable of stepping up high voltages within small form factors via optical couplings. As illustrated in FIG. 1, exemplary high-voltage optical transformer 100 may include and/or represent an array of light-emitting devices 102, a transfer medium 104, and/or an array of photovoltaic cells 106. In some examples, array of light-emitting devices 102 may be electrically coupled and/or connected to an electrical input 108 that carries current from a power source (not necessarily illustrated in FIG. 1). In such examples, array of light-emitting devices 102 may be connected in parallel to one another. For example, the anodes of multiple light-emitting devices may all be electrically coupled and/or connected to the same circuit node, and the cathodes of those light-emitting devices may all be electrically coupled and/or connected to another circuit node.

In some examples, array of photovoltaic cells 106 may be electrically configured and/or connected to an electrical output 110 that carries current to a power-consuming device (not necessarily illustrated in FIG. 1). In such examples, array of photovoltaic cells 106 may be connected in series with one another. For example, the anode of one photovoltaic cell may be electrically coupled to the cathode of another photovoltaic cell. In this example, the anode of that other photovoltaic cell may be electrically coupled to the cathode of a further photovoltaic cell.

In some examples, array of photovoltaic cells 106 may be optically coupled to array of light-emitting devices 102 via transfer medium 104. For example, array of photovoltaic cells 106 may receive and/or obtain light energy transferred from array of light-emitting devices 102 through transfer medium 104. In this example, array of photovoltaic cells 106 may transform and/or convert such light energy into a stepped-up DC electrical output. Accordingly, array of photovoltaic cells 106 may generate and/or produce the DC electrical output from the light energy transferred from array of light-emitting devices 102.

In some examples, light-emitting devices 102 may each include and/or represent any type or form of device capable of producing, emitting, and/or transferring light energy. In one example, light-emitting devices 102 may each include and/or represent one or more Vertical Cavity Surface Emitting Lasers (VCSELs). In this example, the VCSELs may convert electrical energy (e.g., 2 volts DC) into light energy that traverses and/or travels through transfer medium 104. Additional examples of light-emitting devices 102 include, without limitation, Light-Emitting Diodes (LEDs), laser diodes, Vertical External Cavity Surface Emitting Laser (VECSELs), Resonant Cavity LEDs (RCLEDs), Organic LEDS (OLEDs), edge emitters, top or bottom emitters, lasers, surface-emitting lasers, Superluminescent LEDs (SLEDS), combinations or variations of one or more of the same, and/or any other suitable light-emitting devices.

In some examples, array of light-emitting devices 102 may each include and/or represent an indirect bandgap semiconductor or a direct bandgap semiconductor, such as GaAs, Si, InGaAs, AlGaAs, GaN, InGaN, AlGaN, GaP, GaAsP, AlGaInP, and the like. In one example, array of light-emitting devices 102 may be grouped, included, and/or incorporated in a single unit, element, component, and/or die. Additionally or alternatively, array of light-emitting devices 102 may include and/or represent a set or group of discrete units, elements, and/or components.

In some examples, array of photovoltaic cells 106 may include and/or represent a plurality of individual photovoltaic elements. For example, the array may include and/or represent approximately 25, 50, 75, 100, 200 or more photovoltaic cells. Alternatively, the array may include and/or represent any number of photovoltaic cells that falls within the range of the foregoing values. Such an array may be able to generate and/or produce a DC electrical signal that is greater than the open circuit voltage of an individual photovoltaic element. For instance, the open circuit voltage of an array of N photovoltaic elements may be approximately N times the open circuit voltage of an individual photovoltaic element within the array.

In some examples, each photovoltaic cell may include and/or represent a p-n junction and/or p-i-n-junction within a semiconductor to obtain, generate, and/or produce an electric current from photons absorbed near the junction. In one example, each photovoltaic cell may include and/or represent a photodiode. Gallium arsenide (GaAs) may be employed and/or utilized as a direct bandgap material to facilitate high absorption of photons with an energy greater than its bandgap (E g). Additional examples of direct bandgap materials include, without limitation, InGaAs, AlGaAs, GaN, InGaN, AlGaN, GaP, GaAsP, AlGaInP, and the like. In alternate examples, the photovoltaic cells may be manufactured from an indirect bandgap semiconductor such as silicon (Si). For instance, an example monolithic integrated micro photovoltaic cell array may include silicon, where the p-n junctions or p-i-n junctions are formed by lateral doping profiles.

An alternate approach to the development of array of photovoltaic cells 106 may involve the use of metal-semiconductor Schottky barriers to replace the semiconductor-semiconductor p-n junctions. Schottky barriers may be adaptable to economical, versatile manufacturing techniques and are suitable for polycrystalline-based devices. Additionally, since the collecting junction is located at the surface of the device, the collection efficiency through decreased surface recombination may be improved relative to a p-n junction. According to still further embodiments, array of photovoltaic cells 106 may include and/or represent quantum dots or a quantum well. In such embodiments, the bandgap of a quantum dot may be adjusted through a wide range of energy levels by changing the size of the dot.

Array of photovoltaic cells 106 may further include one or more bypass diodes (not necessarily illustrated in FIG. 1) connected in parallel to an individual cell or a grouping of cells to enable current flow through or around unilluminated or damaged cells. Such bypass diodes may be integrated during wafer-level processing of the photodiodes or connected to the array as discrete elements.

In some embodiments, individual photovoltaic cells may include a compound semiconductor and/or be formed en masse during wafer-level processing. Alternatively, individual photovoltaic cells may be formed separately and then transferred (e.g., by pick-and-place or wafer bonding) to a carrier substrate.

In some examples, transfer medium 104 may reside and/or be bonded between array of light-emitting devices 102 and array of photovoltaic cells 106. In one example, transfer medium 104 may include and/or represent an optical connector and/or guide that directs and/or focuses light energy from light-emitting devices 102 to photovoltaic cells 106. In this example, the optical connector and/or guide may include and/or represent any material suitable for guiding light. Such materials may include and/or represent glass, polymer, and/or semiconductor compositions.

In some examples, transfer medium 104 may include and/or incorporate crystalline or amorphous materials. Additionally or alternatively, transfer medium 104 may include and/or incorporate a gas or a liquid (such as a non-conductive oil). In one example, transfer medium 104 may be optically transparent to at least a certain wavelength range of electromagnetic radiation. For example, transfer medium 104 may include and/or represent a non-conductive oil that is optically transparent to electromagnetic radiation within the visible light spectrum. Accordingly, transfer medium 104 may support the transfer of visible light falling within the range of 380 nanometers and 750 nanometers. Additional examples of transfer medium 104 and/or its materials include, without limitation, vacuums (e.g., partial vacuums), dielectric materials (e.g., FR-4 materials), glasses, non-conductive fluids (e.g., oils, argon, and/or xenon), coolant fluids, polymeric materials, epoxies, combinations or variations of one or more of the same, and/or any other suitable transfer media.

In some examples, transfer medium 104 may facilitate and/or provide electrical insulation and/or isolation with a high breakdown strength between array of light-emitting devices 102 and array of photovoltaic cells 106. In such examples, transfer medium 104 may be sized with specific dimensions to control the distance and/or separation between the light-emitting devices and the photovoltaic cells. Accordingly, transfer medium 104 may constitute and/or represent a spacer of known thickness designed to provide the necessary electrical isolation and/or support to the assembly stack of array of light-emitting devices 102 and array of photovoltaic cells 106. In one example, to inhibit reflective losses and/or promote high optical coupling efficiency, transfer medium 104 may be characterized by a refractive index of 1 or greater.

In some examples, transfer medium 104 may include one or more optical elements configured to enhance light extraction and focusing efficiency, such as one or more micro lenses, Total Internal Reflection (TIR) concentrators and/or Total Internal Reflection-Refraction (TIR-R) concentrators. Additionally or alternatively, high-voltage optical transformer 100 may include and/or represent one or more optical elements other than transfer medium 104 that enhance light extraction and focusing efficiency.

In some examples, transfer medium 104 may facilitate and/or provide support or infrastructure for conductors, interconnects, electrical vias (e.g., electrical input 108 and/or electrical output 110). For example, transfer medium 104 may incorporate and/or support solid-state copper-filled vias and/or interconnects formed through hybrid and/or diffusion bonding. In this example, the copper-filled vias and/or interconnects may be positioned and/or formed around or along the periphery and/or perimeter of transfer medium 104. Examples of electrically conductive materials capable of forming such interconnects and/or vias include, without limitation, copper, aluminum, silver, gold, alloys of one or more of the same, combinations or variations of one or more of the same, and/or any other suitable materials.

In some embodiments, array of light-emitting devices 102 may include N emitters, and array of photovoltaic cells 106 array may include N corresponding photovoltaic cells. Accordingly, the light-emitting devices and the photovoltaic cells may have a 1-to-1 ratio and/or relationship relative to one another. In further embodiments, the number of light-emitting devices 102 may exceed the number of photovoltaic cells 106. In additional embodiments, the number of photovoltaic cells 106 may exceed the number of light-emitting devices 102. Transfer medium 104 may further include a micro lens array or other elements configured to focus emitted light onto individual photovoltaic cells, e.g., onto the center of respective photovoltaic cells.

In some examples, array of light-emitting devices 102 may produce and/or emit a wavelength of light energy within a certain range. For example, each light-emitting device may produce and/or emit a wavelength of light energy between 250 nanometers (nm) and 2,500 nm. Additionally or alternatively, each light-emitting device may emit electromagnetic radiation with a wavelength from approximately 10 nm to approximately 1 mm, such as 10 nm, 20 nm, 50 nm, 100 nm, 200 nm, 300 nm, 400 nm, 500 nm, 600 nm, 700 nm, 800 nm, 900 nm, 1 micron (μm), 2 μm, 5 μm, 10 μm, 20 μm, 50 μm, 100 μm, 200 μm, 500 μm, or 1000 μm, including ranges between any of the foregoing values.

Although not illustrated in this way in FIG. 1, high-voltage optical transformer 100 may include and/or incorporate additional electrical components that contribute to stepping up high voltages within small form factors via optical couplings. For example, high-voltage optical transformer 100 may include and/or incorporate filter circuitry that is electrically coupled to array of photovoltaic cells 106. In this example, the filter circuitry may include one or more capacitors (such as decoupling and/or bypass capacitors) that effectively smooth and/or filter the electric output of array of photovoltaic cells 106 to a nearly constant and/or pure DC signal.

In some examples, groups of photovoltaic cells may be connected in parallel to control (e.g., increase) the output current. That is, a photovoltaic cell array may include sub-arrays respectively configured in series and in parallel. Moreover, according to some embodiments, individual photovoltaic cells may be illuminated selectively to control the output voltage of the optical transformer. In certain embodiments, to improve the light absorption efficiency, the light-emitting devices may have an emission spectrum selected to overlap the absorption profile of the photovoltaic cells.

In some examples, array of light-emitting devices 102 may each produce and/or emit a specific wavelength of light energy. In such examples, array of photovoltaic cells 106 may each have and/or exhibit an energy bandgap whose corresponding wavelength is within a certain range of the specific wavelength of light energy produced by array of light-emitting devices 102. As a specific example, each light-emitting device may produce and/or emit light energy of an approximately 850 nm wavelength. In this example, each photovoltaic cell may have and/or exhibit an energy bandgap whose corresponding wavelength is within 100 nm of the approximately 850 nm wavelength. Accordingly, each photovoltaic cell may have and/or exhibit an energy bandgap whose corresponding wavelength is between 750 and 950 nm.

In some embodiments, high-voltage optical transformer 100 may include and/or incorporate one or more additional components and/or elements that are not represented and/or illustrated in FIG. 1. For example, high-voltage optical transformer 100 may include and/or incorporate one or more transistors, resistors, capacitors, inductors, diodes, heatsinks, and/or lead frames, among other components. Some of these components may form and/or constitute filtering and/or smoothing circuitry that flattens and/or smoothens the DC electrical output of high-voltage optical transformer 100. In addition, high-voltage optical transformer 100 may include and/or incorporate one or more ground planes, contacts, and/or nodes within the corresponding circuits.

Figure 2:
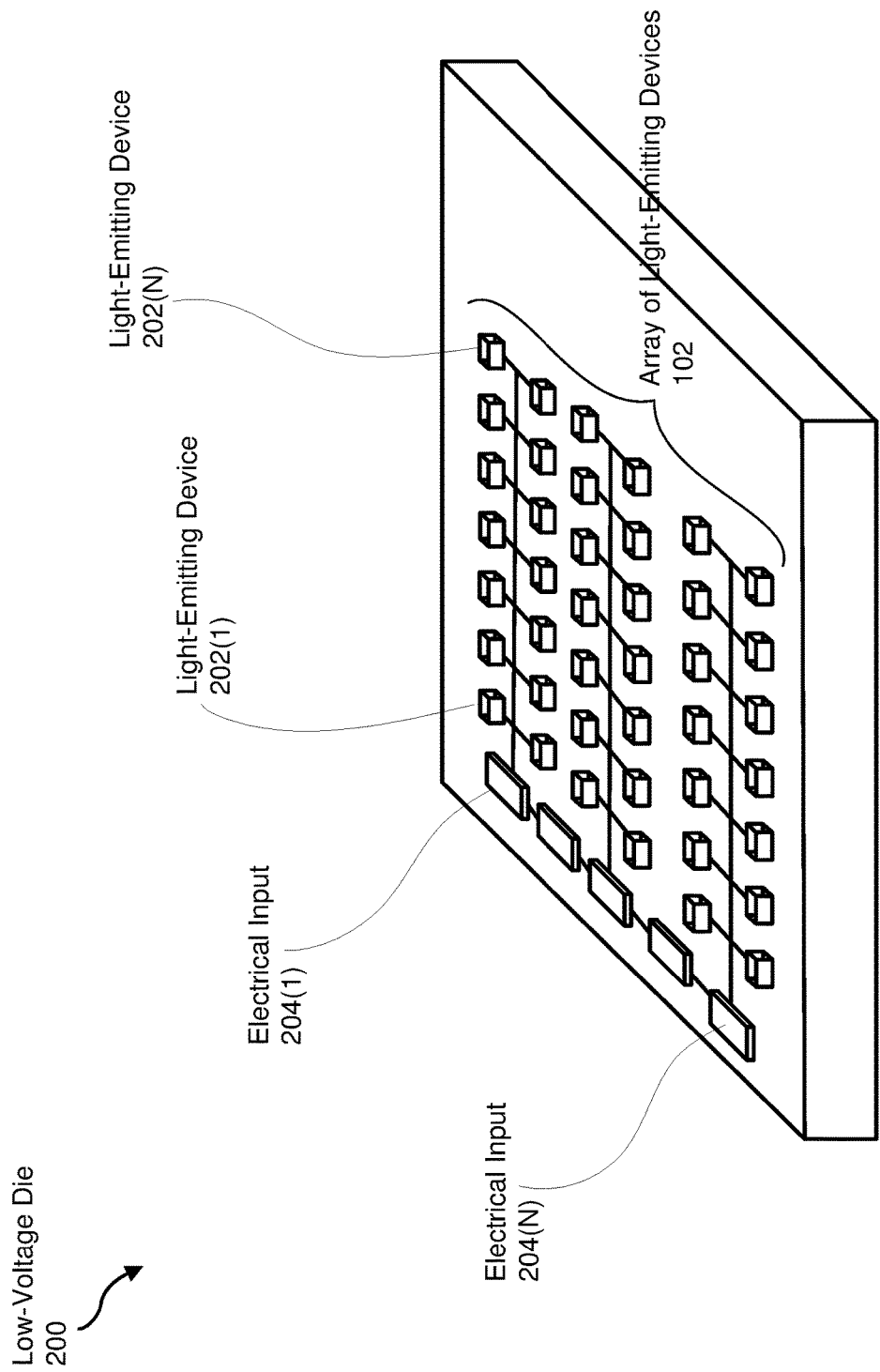
FIG. 2 is a block diagram of an exemplary low-voltage die that includes an array of light-emitting devices for stepping up high voltages within small form factors via optical couplings in accordance with some embodiments.

FIG. 2 illustrates an exemplary low-voltage die 200 that includes and/or incorporates array of light-emitting devices 102 connected in parallel with one another. As illustrated in FIG. 2, array of light-emitting devices 102 may include and/or represent individual light-emitting devices 202(1)-(N). In some examples, low-voltage die 200 may also include and/or incorporate one or more electrical inputs 204(1)-(N) that are electrically coupled and/or connected to light-emitting devices 202(1)-(N). Additionally or alternatively, electrical inputs 204(1)-(N) may carry and/or pass current from a power source (e.g., a battery) to light-emitting devices 202(1)-(N).

Although not necessarily illustrated in this way in FIG. 2, low-voltage die 200 may further include and/or incorporate additional electrical components that contribute to stepping up high voltages within small form factors via optical couplings. For example, low-voltage die 200 may include and/or incorporate one or more ground planes, contacts, and/or nodes that facilitate closing the corresponding circuit.

In some examples, array of light-emitting devices 102 may be laterally arranged and/or disposed on a single planar surface of low-voltage die 200. In one example, electrical inputs 204(1)-(N) may be laterally arranged and/or disposed on the same planar surface of low-voltage die 200 as array of light-emitting devices 102.

Figure 3:
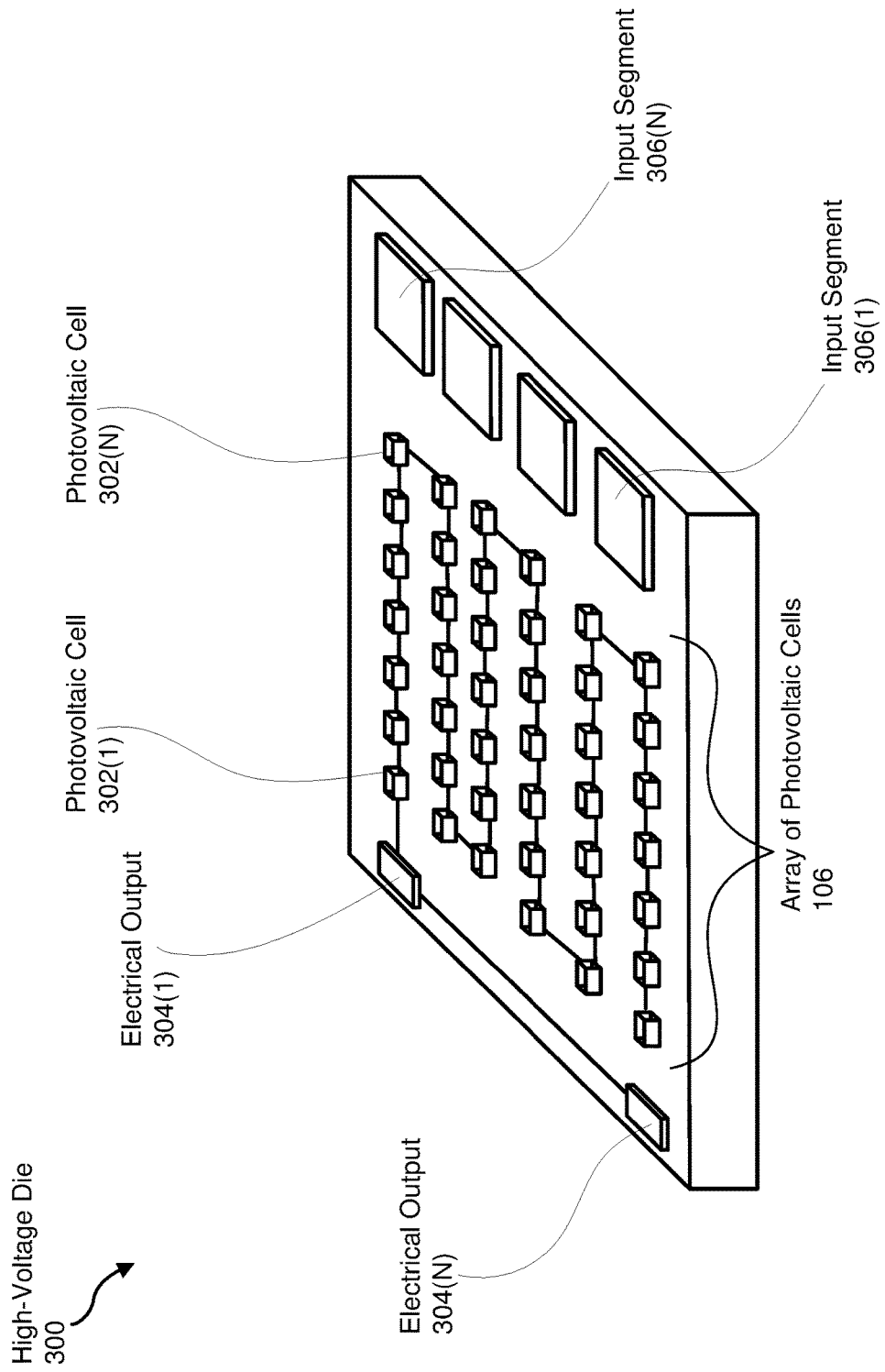
FIG. 3 is a block diagram of an exemplary high-voltage die that includes an array of photovoltaic cells for stepping up high voltages within small form factors via optical couplings in accordance with some embodiments.

FIG. 3 illustrates an exemplary high-voltage die 300 that includes and/or incorporates array of photovoltaic cells 106 connected in series with one another. As illustrated in FIG. 3, array of photovoltaic cells 106 may include and/or represent individual photovoltaic cells 302(1)-(N). In some examples, high-voltage die 300 may also include and/or incorporate one or more electrical outputs 304(1)-(N) that are electrically coupled and/or connected to photovoltaic cells 302(1)-(N). Additionally or alternatively, electrical outputs 304(1)-(N) may carry and/or pass current from photovoltaic cells 302(1)-(N) to a power-consuming device (e.g., a liquid lens device, a piezo actuator, and/or a haptics device).

In some examples, high-voltage die 300 may include and/or incorporate one or more input segments 306(1)-(N). In one example, input segments 306(1)-(N) may include and/or represent conductive pads that form part of and/or make electrical contact with electrical input 108 of transfer medium 104. Although not necessarily illustrated in this way in FIG. 3, high-voltage die 300 may further include and/or incorporate additional electrical components that contribute to stepping up high voltages within small form factors via optical couplings. For example, high-voltage die 300 may include and/or incorporate one or more ground planes, contacts, and/or nodes that facilitate closing the corresponding circuit.

In some examples, array of photovoltaic cells 106 may be laterally arranged and/or disposed on a single planar surface of high-voltage die 300. In one example, electrical outputs 304(1)-(N) may be laterally arranged and/or disposed on the same planar surface of high-voltage die 300 as array of photovoltaic cells 106.

In some embodiments, the greater the number of light-emitting devices and photovoltaic cells involved in the optical coupling, the higher the voltage output of the transformer may become. For example, if 5,000 instances of light-emitting devices and photovoltaic cells are disposed on low-voltage die 200 and high-voltage die 300, respectively, high-voltage optical transformer 100 may be able to output a voltage level of approximately 500 volts DC. However, if 10,000 instances of light-emitting devices and photovoltaic cells are disposed on low-voltage die 200 and high-voltage die 300, respectively, high-voltage optical transformer 100 may be able to output a voltage level of approximately 1,000 volts DC.

The terms "high-voltage die" and "low-voltage die," as used herein, generally refer to dies whose respective voltage levels are referenced as a basis for differentiation. In one example, low-voltage die 200 may receive and/or draw input power whose voltage level is lower than the voltage level of the output power produced by high-voltage die 300. Put differently, high-voltage die 300 may generate and/or produce output power whose voltage level is higher than the voltage level of the input power received by low-voltage die 200. Low-voltage die 200 and high-voltage die 300 may also be referred to and/or described as input die and output die, respectively.

Figure 4:
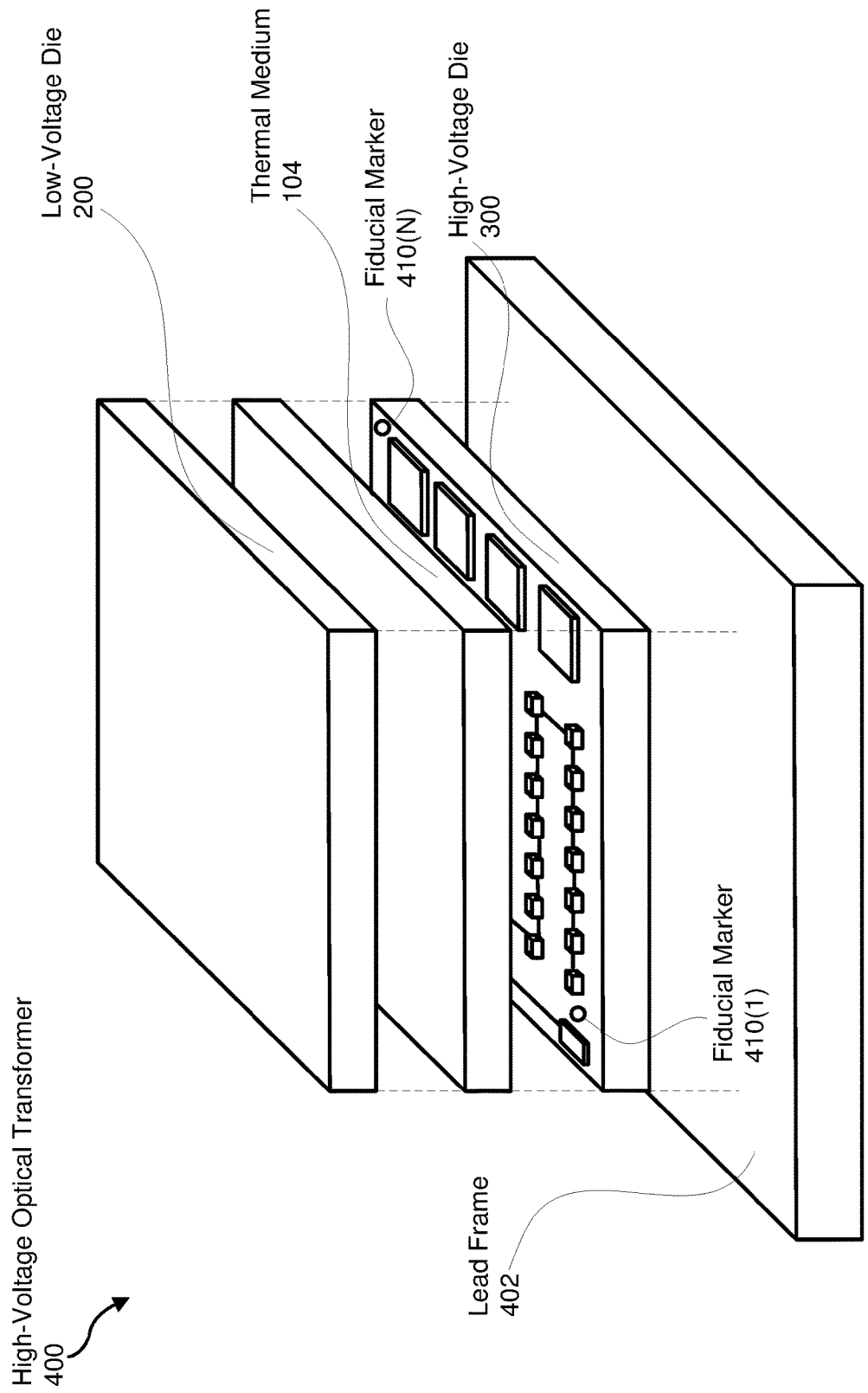
FIG. 4 is a block diagram of an additional exemplary high-voltage optical transformer for stepping up high voltages within small form factors via optical couplings in accordance with some embodiments.

FIG. 4 illustrates an exploded view of an exemplary high-voltage optical transformer 400. As illustrated in FIG. 4, high-voltage optical transformer 400 may include and/or represent a stack of low-voltage die 200, transfer medium 104, high-voltage die 300, and a lead frame 402. In some examples, transfer medium 104 may be physically coupled to high-voltage die 300 using any of a variety of bonding techniques. Examples of such bonding techniques include, without limitation, hybrid bonding, diffusion bonding, fusion bonding (e.g., low-temperature fusion bonding), wafer-to-wafer bonding, die-to-wafer bonding, gang bonding, combinations or variations of one or more of the same, and/or any other suitable bonding techniques.

In some examples, low-voltage die 200 may be physically coupled to transfer medium 104 using any of a variety of bonding techniques, including any of those mentioned above in connection with the physical coupling formed between transfer medium 104 and high-voltage die 300. In one example, the assembly of low-voltage die 200, transfer medium 104, and high-voltage die 300 may be physically coupled and/or attached to lead frame 402. In this example, the resulting component stack may be over-molded and/or potted in a solid and/or gelatinous compound for purposes of electrical isolation and/or protection against light leakage. The potting compound may include and/or represent material that is optically opaque and/or non-conductive. Examples of such potting compounds include, without limitation, plastics, silicone rubbers, gels, epoxies, resins, combinations or variations of one or more of the same, and/or any other suitable potting compounds.

In some examples, low-voltage die 200 and high-voltage die 300 may need proper alignment relative to one another to achieve a strong optical coupling between array of light-emitting devices 102 and array of photovoltaic cells 106. In other words, each light-emitting device may be aligned with a corresponding photovoltaic cell to ensure that sufficient light energy is transferred to that photovoltaic cell. To achieve this alignment, one or more fiducial markers 410(1)-(N) may be applied to a portion of high-voltage optical transformer 400 and/or to a portion of the wafer from which singulated high-voltage die 300 originated. For example, high-voltage die 300 may include and/or incorporate fiducial markers 410(1)-(N) that serve as references for aligning light-emitting devices 102 with array of photovoltaic cells 106. Accordingly, fiducial markers 410 may indicate and/or be used to determine whether array of light-emitting devices 102 are properly aligned with array of photovoltaic cells 106 during fabrication and/or assembly.

Additionally or alternatively, low-voltage die 200 and high-voltage die 300 may be aligned with one another and/or tested for proper alignment using active alignment techniques. For example, the electrical output of high-voltage optical transformer 400 may be observed and/or tested to determine whether its voltage level has reached a certain threshold representative of proper alignment. In this example, once the voltage level of the electrical output reaches that threshold, the alignment between array of light-emitting devices 102 and array of photovoltaic cells 106 may be deemed proper and/or sufficient.

Figure 5:
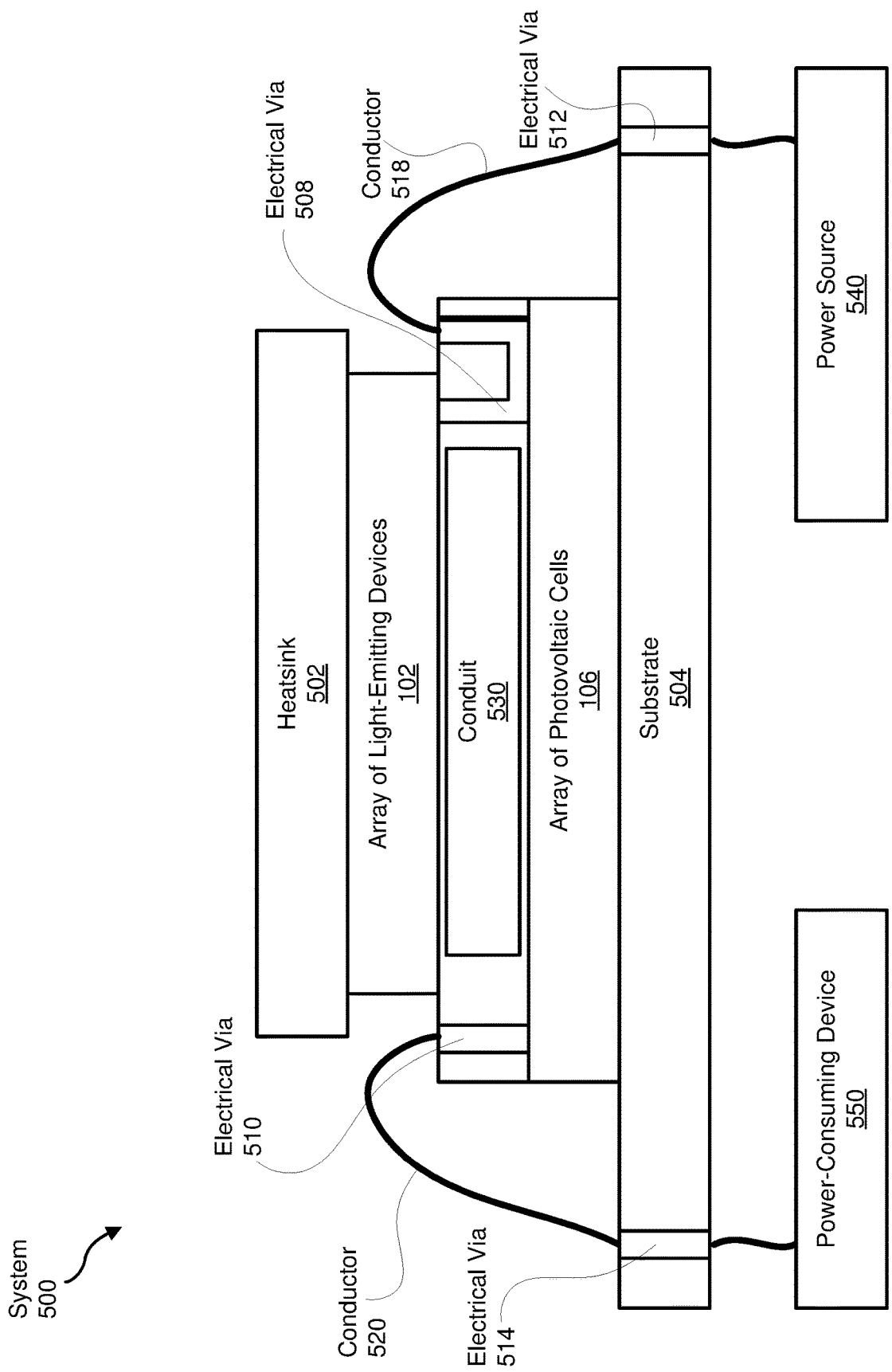
FIG. 5 is a block diagram of an exemplary system for stepping up high voltages within small form factors via optical couplings in accordance with some embodiments.

FIG. 5 illustrates an exemplary system 500 for stepping up high voltages within small form factors via optical couplings. As illustrated in FIG. 5, system 500 may include and/or incorporate array of light-emitting devices 102, transfer medium 104, and array of photovoltaic cells 106 bonded together as a high-voltage optical transformer. In one example, array of photovoltaic cells 106 may be physically coupled and/or attached to a substrate 504. Additionally or alternatively, array of photovoltaic cells 106 may be embedded within substrate 504.

In some examples, substrate 504 may include and/or represent a lead frame (e.g., lead frame 402). In other examples, substrate 504 may include and/or represent a dielectric material, such as FR-4, that facilitates and/or supports electrical and/or thermal connectivity with the high-voltage optical transformer. In one example, substrate 504 may constitute and/or represent the foundation and/or base of an integrated circuit package, such as a Ball Grid Array (BGA) package, a micro BGA package, a Chip Scale Package (CSP), and/or any other suitable package.

As illustrated in FIG. 5, system 500 may include and/or incorporate a heatsink 502 that is physically and/or thermally coupled or attached to array of light-emitting devices 102. In one example, heatsink 502 may include and/or represent any thermal clip, device, structure, and/or mechanism that conducts, transfers, absorbs, and/or sinks heat. Heatsink 502 may include and/or contain any of a variety of conductive materials. Examples of such materials include, without limitation, copper, aluminum, diamond, alloys of one or more of the same, combinations or variations of one or more of the same, and/or any other suitable materials.

In one embodiment, the combination of heatsink 502 and substrate 504 may facilitate and/or provide dual side cooling for the high-voltage optical transformer. Such dual side cooling may ensure that the high-voltage optical transformer's performance is not degraded and/or impaired by overheating.

In some examples, all the electrical connections made with bonding wire within the high-voltage optical transformer may be formed and/or established on a single planar surface. In one example, transfer medium 104 may facilitate, support, and/or provide connection points for array of light-emitting devices 102 and array of photovoltaic cells 106 on a single planar surface. For example, transfer medium 104 may include and/or incorporate an electrical via 508 that is electrically coupled to array of light-emitting devices 102. In this example, electrical via 508 may be accessible on and/or at the surface of transfer medium 104 that faces array of light-emitting devices 102. Similarly, transfer medium 104 may include and/or incorporate an electrical via 510 that is electrically coupled to array of photovoltaic cells 106. In this example, like electrical via 508, electrical via 510 may be accessible on and/or at the surface of transfer medium 104 that faces array of light-emitting devices 102.

In some examples, electrical vias 508 and 510 may include and/or represent multiple segments and/or conductors designed and/or configured to facilitate electrically coupling different layers of the high-voltage optical transformer to one another via transfer medium 104. For example, electrical via 508 may include and/or represent a first segment that extends from the electrical connection (with, e.g., conductor 518) at the surface of transfer medium 104 facing array of light-emitting devices 102 to the surface of transfer medium 104 facing array of photovoltaic cells 106. In this example, electrical via 508 may also include and/or represent a second segment that extends along the surface of transfer medium 104 facing the array of photovoltaic cells 106 toward electrical via 510 and/or the center of transfer medium 104. Finally, electrical via 508 may include and/or represent a third segment that extends from the surface of transfer medium 104 facing array of photovoltaic cells 106 to the surface of transfer medium facing array of light-emitting devices 102.

In one example, electrical via 510 may include and/or represent a conductor that extends from the surface of transfer medium 104 facing array of photovoltaic cells 106 to the surface of transfer medium 104 facing array of light-emitting devices 102. In this example, electrical vias 508 and 510 may form and/or establish electrical connections with conductors 518 and 520, respectively. Conductors 518 and 520 may include and/or represent bonding wires within the high-voltage optical transformer.

In some examples, conductors 518 and 520 may electrically couple electrical vias 508 and 510 of transfer medium 104 to electrical vias 512 and 514 of substrate 504 of substrate 504, respectively. In one example, a power source 540 (e.g., a battery) may be electrically coupled to electrical via 512 of substrate 504. In this example, electrical continuity between power source 540 and array of light-emitting devices 102 may be formed and/or established though electrical via 512, conductor 518, and/or electrical via 508. Accordingly, power source 540 may provide and/or deliver power to array of light-emitting devices 102 through electrical via 512, conductor 518, and/or electrical via 508.

In one example, a power-consuming device 550 may be electrically coupled to electrical via 514 of substrate 504. In this example, electrical continuity between power-consuming device 550 and array of photovoltaic cells 106 may be formed and/or established though electrical via 514, conductor 520, and/or electrical via 510. Accordingly, power-consuming device 550 may draw and/or obtain power from array of photovoltaic cells 106 through electrical via 514, conductor 520, and/or electrical via 510.

In some examples, system 500 in FIG. 5 may represent and/or be implemented as an artificial-reality headset (e.g., an augmented-reality display) or a wearable device designed to be worn by a user. In one example, power-consuming device 550 may include and/or represent a liquid lens device, a diopter, an actuator, and/or a haptics device incorporated into the artificial-reality headset and/or the wearable device. Additionally or alternatively, power source 540 may include and/or represent a battery pack incorporated into the artificial-reality headset and/or the wearable device. In this example, power source 540 may provide and/or deliver low-voltage power (e.g., 2 volts DC, 5 volts DC, etc.) to the high-voltage optical transformer, which converts the low-voltage power to high-voltage power (e.g., 100 volts DC, 500 volts DC, etc.). The high-voltage optical transformer may then output the high-voltage power to power-consuming device 550.

As illustrated in FIG. 5, transfer medium 104 may include and/or form a conduit that facilitates circulation, flow, and/or passage of dielectric or non-conductive fluid (such as oil). In one example, a pump may cause oil (e.g., DC-705 oil) to circulate and/or flow between array of light-emitting devices 102 and array of photovoltaic cells 106. In this example, the circulating oil may serve and/or function as the transfer medium through which light energy is passed from array of light-emitting devices 102 to array of photovoltaic cells 106. The circulating oil may simultaneously serve a plethora of purposes and/or benefits. For example, the circulating oil may serve as the transfer medium and may also provide a heat transfer function to the high-voltage optical transformer. In other words, in addition to being the transfer medium between array of light-emitting devices 102 and array of photovoltaic cells 106, the circulating oil may also absorb and/or dissipate heat emitted by array of light-emitting devices 102 and/or array of photovoltaic cells 106. Additionally or alternatively, the circulating oil may also be used and/or implemented to facilitate changing the diopter included in the liquid lens device of the artificial-reality system.

In some examples, the non-conductive fluid may serve and/or act as both a coolant and a transfer medium that flows between low-voltage die 200 and high-voltage die 300. In other examples, the non-conductive fluid may serve and/or act as a coolant in which high-voltage optical transformer 100 is submerged, and a different transfer medium may be applied between low-voltage die 200 and high-voltage die 300. In additional examples, high-voltage optical transformer 100 may be submerged in the non-conductive fluid such that the fluid encompasses high-voltage optical transformer 100 for cooling purposes and also serves as the transfer medium between low-voltage die 200 and high-voltage die 300.

Figure 6:
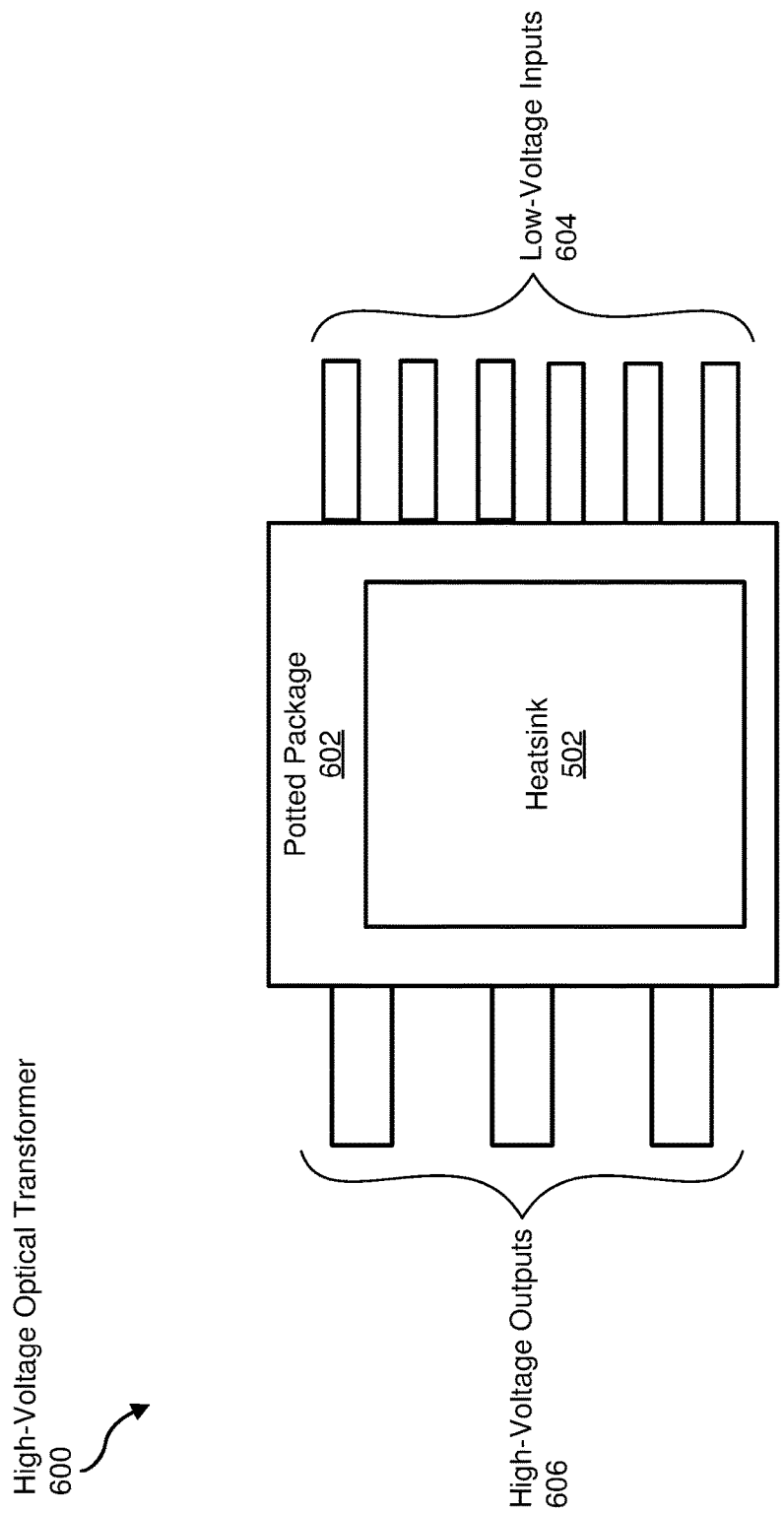
FIG. 6 is a block diagram of an additional exemplary high-voltage optical transformer for stepping up high voltages within small form factors via optical couplings in accordance with some embodiments.

FIG. 6 illustrates an exemplary high-voltage optical transformer 600 for stepping up high voltages within small form factors via optical couplings. As illustrated in FIG. 6, high-voltage optical transformer 600 may include and/or represent a potted package 602 that at least partially envelops array of light-emitting devices 102 and/or array of photovoltaic cells 106 with a solid and/or gelatinous compound. In one example, potted package 602 may support and/or provide electrical isolation and/or protection against light leakage to high-voltage optical transformer 600. The potting compound may include and/or represent material that is optically opaque and/or non-conductive.

In some examples, high-voltage optical transformer 600 may also include and/or represent one or more low-voltage inputs 604 capable of carrying power from a power source to array of light-emitting devices 102 via potted package 602. In such examples, high-voltage optical transformer 600 may further include and/or represent one or more high-voltage outputs 606 capable of carrying power from array of photovoltaic cells 106 to a power-consuming device via potted package 602. Additionally or alternatively, heatsink 502 may be thermally coupled and/or attached to potted package 602 for heat-transfer purposes.

Figure 7:
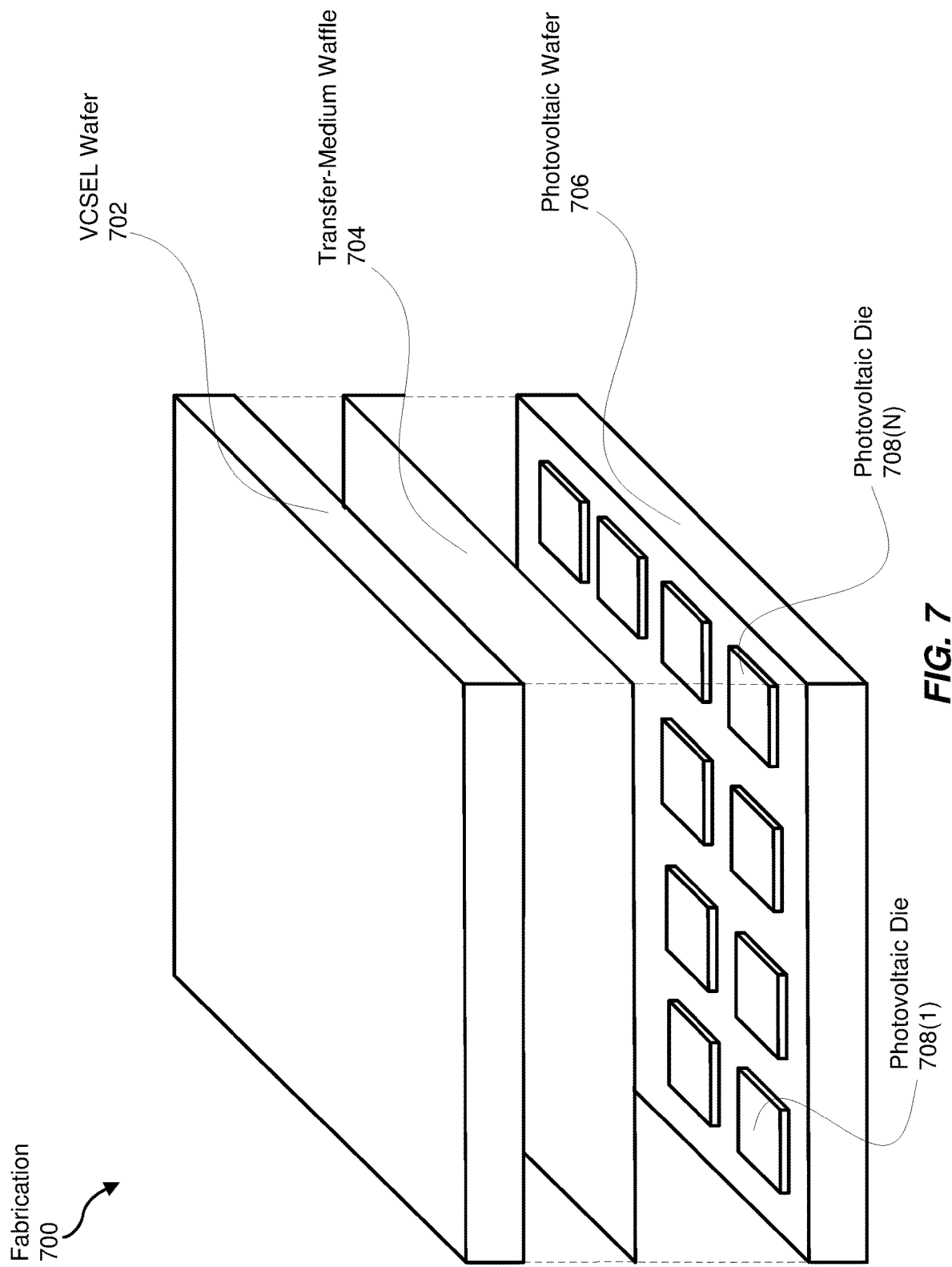
FIG. 7 is a block diagram of an exemplary fabrication of multiple high-voltage optical transformers that are assembled simultaneously.

FIG. 7 illustrates an exemplary fabrication 700 of high-voltage optical transformers on a wafer scale. As illustrated in FIG. 7, fabrication 700 may involve a wafer-scale assembly of various VCSELs, transfer media, and/or photovoltaic dies 708(1)-(N). In some examples, as part of fabrication 700, a VCSEL wafer 702 may include and/or carry various VCSELs, and a photovoltaic wafer 706 may include and/or carry various photovoltaic dies 708(1)-(N). In such examples, a transfer-medium waffle 704 may include and/or represent various instances of transfer medium 104.

In one example, fabrication 700 of high-voltage optical transformers may be achieved and/or implemented though low-temperature fusion, diffusion, and/or hybrid bonding. This low-temperature bonding may facilitate high accuracy optical coupling between the VCSELs and photovoltaic cells 708(1)-(N). Moreover, this low-temperature bonding may ensure that the optical coupling is not affected and/or impaired by different thermal expansion properties of the materials as the temperature returns to steady state. Additionally or alternatively, this low-temperature bonding may facilitate a proper seal between components using a thin oxide adhesion layer.

In some examples, fabrication 700 may involve and/or represent the simultaneous wafer-scale assembly of various high-voltage optical transformers. In such examples, the high-voltage optical transformers illustrated in FIGS. 1 and 4-6 may each constitute and/or represent one of many singulated instances resulting from fabrication 700.

Figure 8:
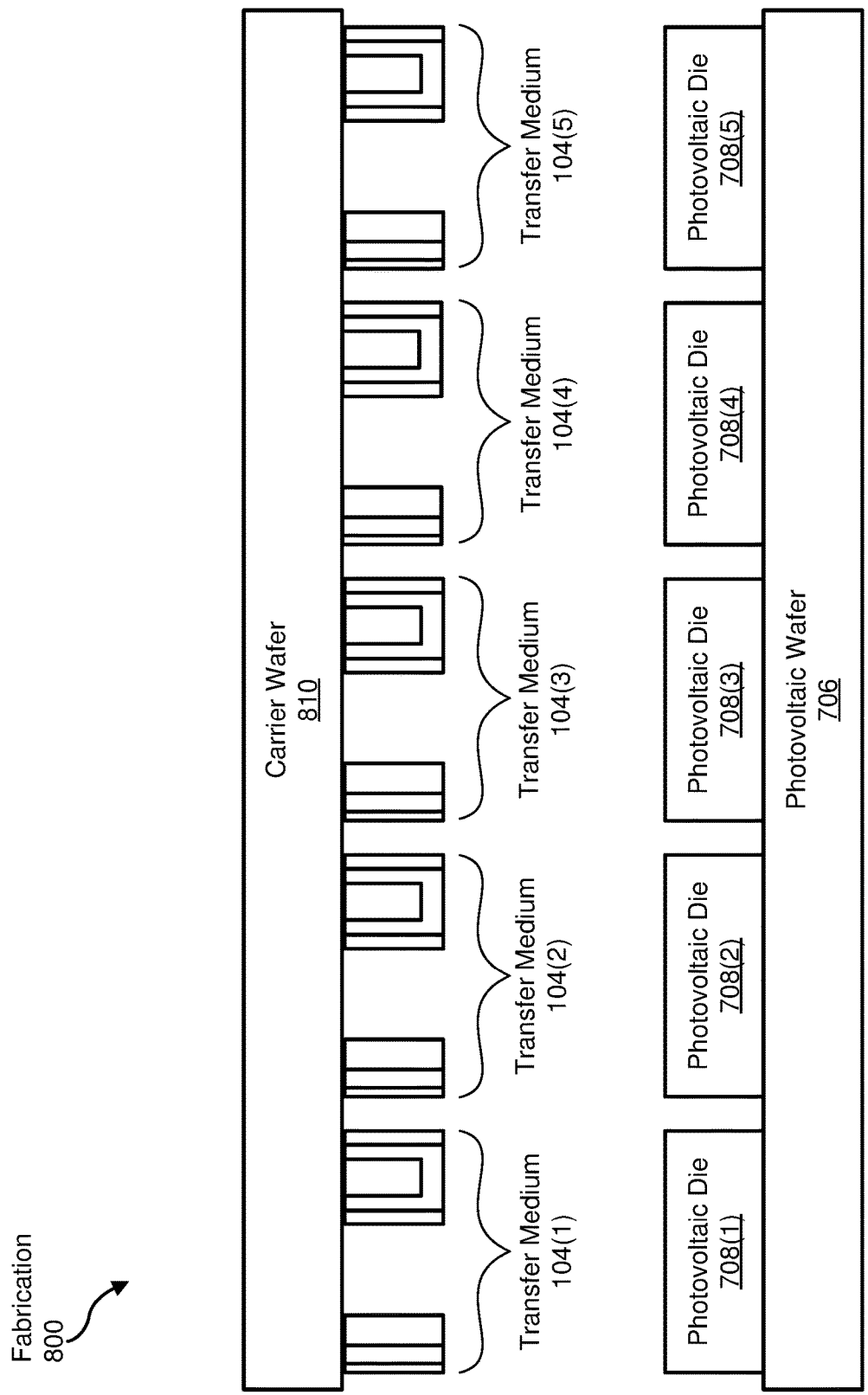
FIG. 8 is a block diagram of an additional exemplary fabrication of multiple high-voltage optical transformers that are assembled simultaneously.
Figure 9:
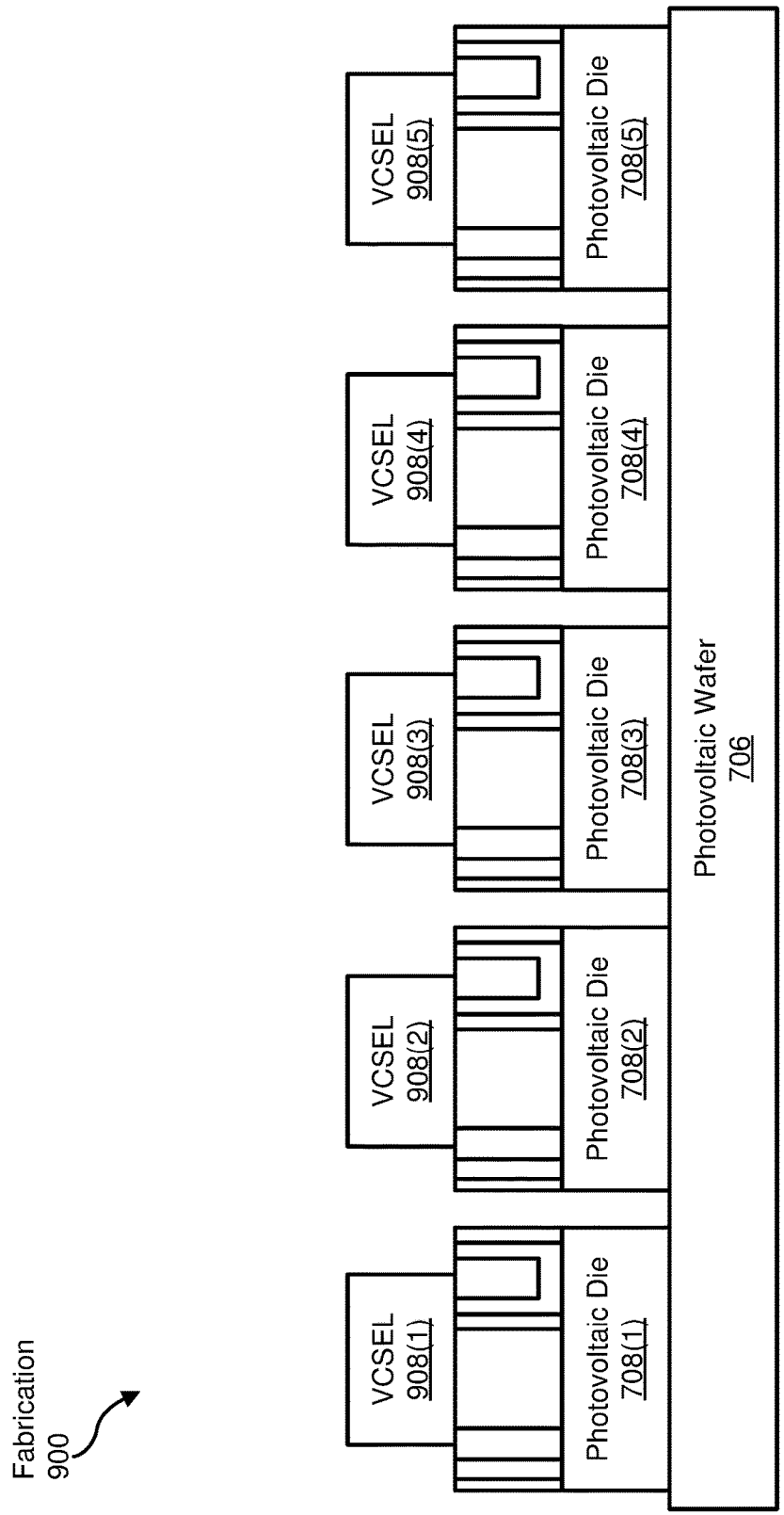
FIG. 9 is a block diagram of an additional exemplary fabrication of multiple high-voltage optical transformers that are assembled simultaneously.

FIGS. 8 and 9 illustrate certain steps involved in an exemplary fabrication 800 of high-voltage optical transformers on a wafer scale. As illustrated in FIG. 8, fabrication 800 may involve and/or represent the physical coupling and/or bonding of transfer media 104(1), 104(2), 104(3), 104(4), and/or 104(5) to photovoltaic dies 708(1), 708(2), 708(3), 708(4), and/or 708(5), respectively. In some examples, transfer media 104(1)-(5) may be carried and/or applied simultaneously to photovoltaic dies 708(1)-(5) by a carrier wafer 810. In one example, each of transfer media 104(1)-(5) may include and/or form a cavity that facilitates and/or supports the creation of a vacuum and/or the circulation of non-conductive fluid. Additionally or alternatively, dicing kerfs may form and/or exist between transfer media 104(1)-(5) on carrier wafer 810.

As illustrated in FIG. 9, fabrication 900 may involve and/or represent the physical coupling and/or bonding of VCSELs 908(1), 908(2), 908(3), 908(4), and/or 908(5) atop transfer media 104(1)-(5), respectively. In some examples, the physical coupling of VCSELs 908(1)-(5) to transfer media 104(1)-(5) may be achieved and/or implemented through individual die-to-wafer bonding and/or gang bonding techniques.

FIG. 10 is a flow diagram of an exemplary method 1000 for stepping up high voltages within small form factors via optical couplings. In one example, the steps shown in FIG. 10 may be performed as part of manufacturing, fabricating, and/or assembling a high-voltage optical transformer. Additionally or alternatively, the steps shown in FIG. 10 may also incorporate and/or involve various sub-steps and/or variations consistent with the descriptions provided above in connection with FIGS. 1-9.

As illustrated in FIG. 10, method 1000 may include a step 1010 in which a low-voltage die that includes an array of light-emitting devices that are connected in parallel with one another and are configured to be powered via an electrical input. In one example, a transformer manufacturer or subcontractor may manufacture, fabricate, and/or assemble a low-voltage die that includes an array of light-emitting devices that are connected in parallel with one another and are configured to be powered via an electrical input. For example, the transformer manufacturer or subcontractor may use lithography to dispose and/or arrange an array of light-emitting devices on a low-voltage die and/or component. In this example, the transformer manufacturer or subcontractor may connect and/or electrically couple the array of light-emitting devices in parallel with one another. Additionally or alternatively, the transformer manufacturer or subcontractor may configure the array of light-emitting devices to be powered via an electrical input.

As illustrated in FIG. 10, method 1000 may also include a step 1020 in which a high-voltage die that includes an array of photovoltaic cells that are connected in series with one another and are configured to produce an electrical output whose voltage is higher than the electrical input. In one example, the transformer manufacturer or subcontractor may manufacture, fabricate, and/or assemble a high-voltage die that includes an array of photovoltaic cells that are connected in series with one another and are configured to produce an electrical output whose voltage is higher than the electrical input of the low-voltage die.

As illustrated in FIG. 10, method 1000 may also include a step 1030 in which a high-voltage output transformer is formed with the low-voltage die and the high-voltage die by bonding a transfer medium between the low-voltage die and the high-voltage die and optically coupling the array of light-emitting devices to the array of photovoltaic cells via the transfer medium. In one example, the transformer manufacturer or subcontractor may manufacture, fabricate, and/or assemble a high-voltage optical transformer by bonding a transfer medium between the low-voltage die and the high-voltage die. In this example, the transformer manufacturer or subcontractor may optically couple the array of light-emitting devices to the array of photovoltaic cells by aligning them based at least in part on fiducial markers and/or active-output observation.

EXAMPLE EMBODIMENTS

Example 1: A high-voltage optical transformer comprising (1) an array of light-emitting devices that are connected in parallel with one another and are electrically coupled to an electrical input, (2) a transfer medium, and (3) an array of photovoltaic cells that are optically coupled to the array of light-emitting devices via the transfer medium, are connected in series with one another, and produce an electrical output whose voltage is higher than the electrical input.

Example 2: The high-voltage optical transformer of Example 1, wherein (1) each photovoltaic cell included in the array of photovoltaic cells is optically coupled to a single light-emitting device included in the array of light-emitting devices, and (2) each light-emitting device included in the array of light-emitting devices is optically coupled to a single photovoltaic cell included in the array of photovoltaic cells.

Example 3: The high-voltage optical transformer of Example 1, wherein the transfer medium is bonded between the array of light-emitting devices and the array of photovoltaic cells.

Example 4: The high-voltage optical transformer of Example 3, further comprising a heatsink that is thermally coupled to the array of light-emitting devices opposite the transfer medium such that the array of light-emitting devices resides between the heatsink and the transfer medium.

Example 5: The high-voltage optical transformer of Example 1, wherein the transfer medium comprises (1) at least one conductor that electrically couples a power source to the array of light-emitting devices and (2) at least one additional conductor that electrically couples the electrical output produced by the array of photovoltaic cells to a power-consuming device.

Example 6: The high-voltage optical transformer of Example 5, wherein (1) the conductor of the transfer medium forms an electrical connection to the power source at a surface facing the array of light-emitting devices and (2) the additional conductor of the transfer medium forms an additional electrical connection to the power-consuming device at the surface facing the array of light-emitting devices.

Example 7: The high-voltage optical transformer of Example 6, wherein the conductor of the transfer medium comprises (1) a first segment that extends from the electrical connection at the surface facing the array of light-emitting devices through the transfer medium to an additional surface facing the array of photovoltaic cells, (2) a second segment that extends along the additional surface facing the array of the photovoltaic cells toward the additional conductor of the transfer medium, and (3) a third segment that extends from the additional surface facing the array of photovoltaic cells through the transfer medium to the surface facing the array of light-emitting devices.

Example 8: The high-voltage optical transformer of Example 7, wherein the additional conductor of the transfer medium extends from the additional surface facing the array of photovoltaic cells to the additional electrical connection at the surface facing the array of light-emitting devices.

Example 9: The high-voltage optical transformer of Example 1, wherein (1) the array of light-emitting devices are laterally arranged on a low-voltage die, (2) the array of photovoltaic cells are laterally arranged on a high-voltage die, and (3) the transfer medium electrically isolates the low-voltage die and the high-voltage die from one another.

Example 10: The high-voltage optical transformer of Example 9, wherein the high-voltage die is physically coupled to a lead frame and/or a substrate of an integrated circuit package.

Example 11: The high-voltage optical transformer of Example 9, wherein the low-voltage die, the transfer medium, and the high-voltage die are potted in an opaque non-conductive material.

Example 12: The high-voltage optical transformer of Example 9, wherein the low-voltage die is aligned relative to the high-voltage die atop the transfer medium according to one or more fiducial markers.

Example 13: The high-voltage optical transformer of Example 1, wherein the transfer medium comprises at least one of a vacuum, a dielectric material, a glass, a non-conductive fluid, a polymeric material, or an epoxy.

Example 14: The high-voltage optical transformer of Example 1, wherein the transfer medium is optically transparent to support a transfer of electromagnetic radiation from the array of light-emitting devices to the array of photovoltaic cells.

Example 15: The high-voltage optical transformer of Example 14, wherein the transfer medium supports the transfer of electromagnetic radiation within a visible light spectrum ranging between 380 nanometers and 750 nanometers.

Example 16: The high-voltage optical transformer of Example 1, wherein the transfer medium includes a conduit that facilitates circulation of a dielectric fluid through which electromagnetic radiation generated by the array of light-emitting devices passes via the optical coupling.

Example 17: The high-voltage optical transformer of Example 1, wherein the array of light-emitting devices comprises a plurality of VCSELs.

Example 18: An artificial-reality system comprising (1) a head-mounted display and (2) a high-voltage optical transformer incorporated into the head-mounted display, wherein the high-voltage optical transformer comprises (1) an array of light-emitting devices that are connected in parallel with one another and are electrically coupled to an electrical input, (2) a transfer medium, and (3) an array of photovoltaic cells that are optically coupled to the array of light-emitting devices via the transfer medium, are connected in series with one another, and produce an electrical output whose voltage is higher than the electrical input.

Example 19: The artificial-reality system of Example 18, further comprising a liquid lens device that (1) is incorporated into the head-mounted display, (2) is powered by the electrical output produced by the array of photovoltaic cells, and (3) includes a diopter, and wherein the transfer medium of the high-voltage optical transformer comprises a non-conductive oil that facilitates changing the diopter included in the liquid lens device.

Example 20: A method comprising (1) manufacturing a low-voltage die that includes an array of light-emitting devices that are connected in parallel with one another and are configured to be powered via an electrical input, (2) manufacturing a high-voltage die that includes an array of photovoltaic cells that are connected in series with one another and are configured to produce an electrical output whose voltage is higher than the electrical input; and forming a high-voltage optical transformer with the low-voltage die and the high-voltage die by: bonding a transfer medium between the low-voltage die and the high-voltage die, and (3) optically coupling the array of light-emitting devices to the array of photovoltaic cells via the transfer medium.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive electrical energy, transform the electrical energy to light energy, and then transform the light energy back into electrical energy. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 1100 in FIG. 11) or that visually immerses a user in an artificial reality (such as, e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
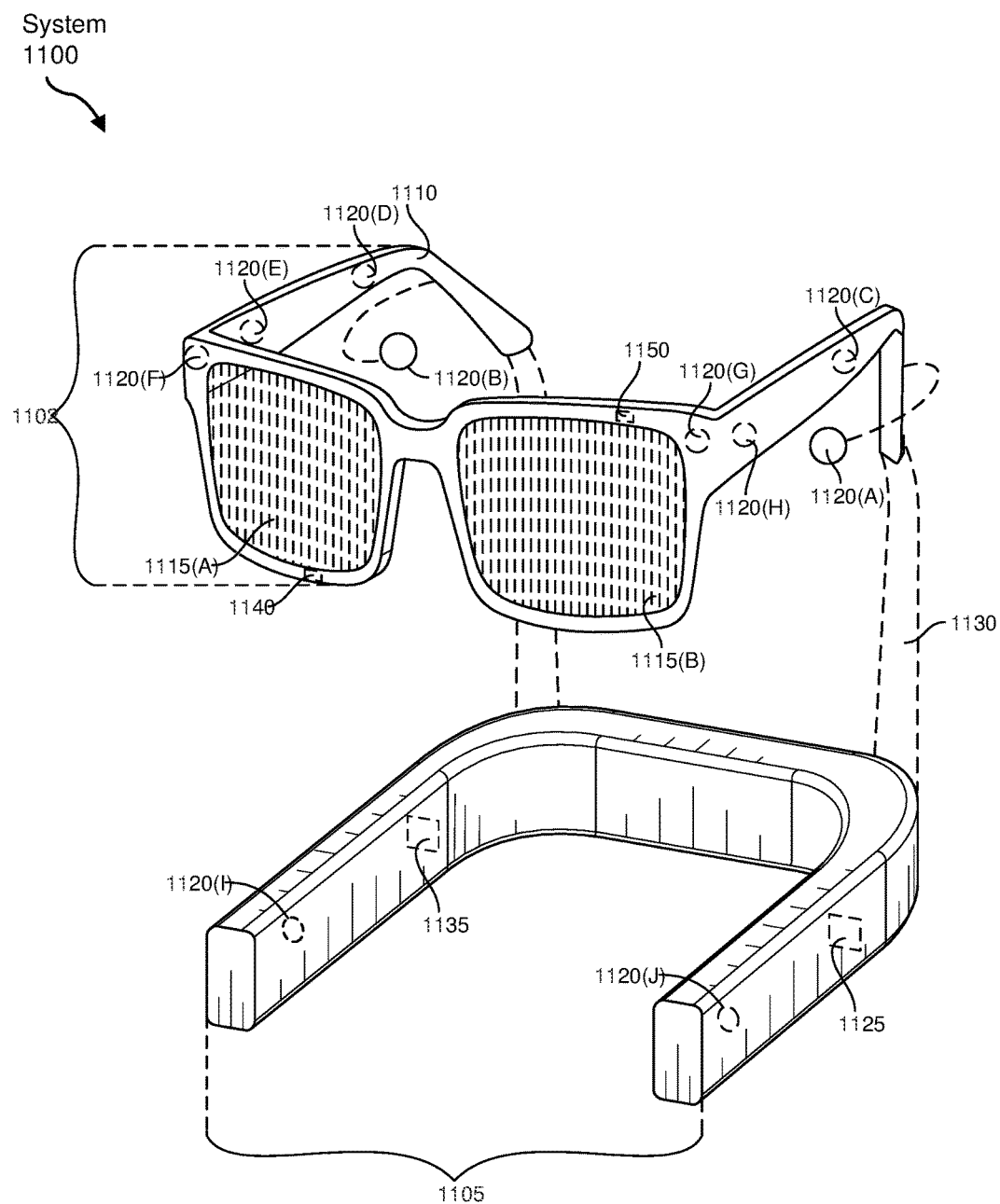
FIG. 11 is an illustration of exemplary augmented-reality glasses that may be used in connection with embodiments of this disclosure.

Turning to FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent one or more of a variety of different sensing mechanisms, such as a position sensor, an inertial measurement unit (IMU), a depth camera assembly, a structured light emitter and/or detector, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

In some examples, augmented-reality system 1100 may also include a microphone array with a plurality of acoustic transducers 1120(A)-1120(J), referred to collectively as acoustic transducers 1120. Acoustic transducers 1120 may represent transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(J) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna, behind the tragus, and/or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments acoustic transducers 1120(A) and 1120(B) may be connected to augmented-reality system 1100 via a wireless connection (e.g., a BLUETOOTH connection). In still other embodiments, acoustic transducers 1120(A) and 1120(B) may not be used at all in conjunction with augmented-reality system 1100.

Acoustic transducers 1120 on frame 1110 may be positioned in a variety of different ways, including along the length of the temples, across the bridge, above or below display devices 1115(A) and 1115(B), or some combination thereof. Acoustic transducers 1120 may also be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers, other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(1) and 1120(J)) that are part of the microphone array (or potentially form their own microphone subarray). Neckband 1105 may also include a controller 1125 and a power source 1135.

Acoustic transducers 1120(1) and 1120(J) of neckband 1105 may be configured to detect sound and convert the detected sound into an electronic format (analog or digital). In the embodiment of FIG. 11, acoustic transducers 1120(1) and 1120(J) may be positioned on neckband 1105, thereby increasing the distance between the neckband acoustic transducers 1120(1) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 1100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 1100 and 1200 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 13:
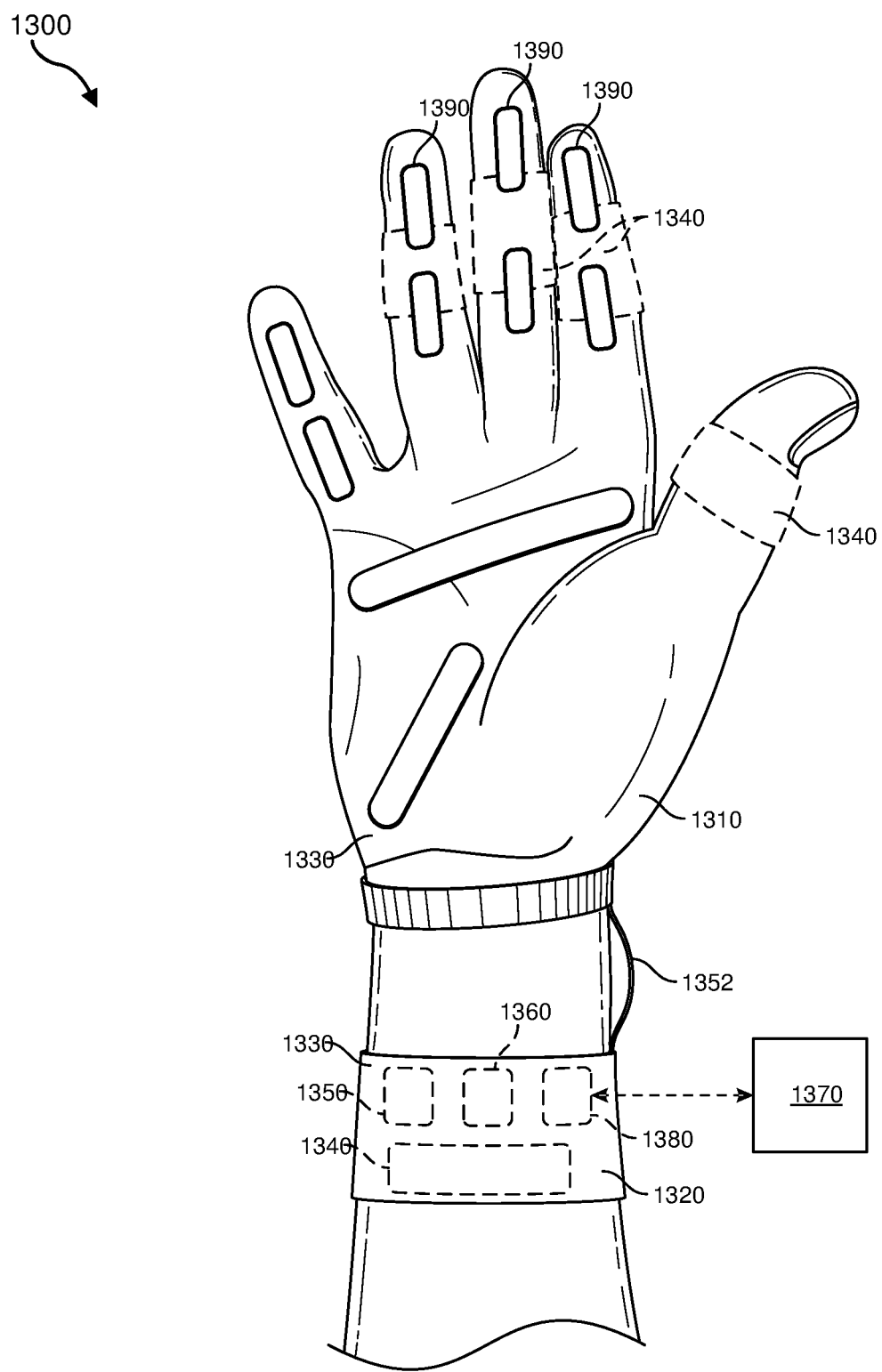
FIG. 13 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 13 illustrates a vibrotactile system 1300 in the form of a wearable glove (haptic device 1310) and wristband (haptic device 1320). Haptic device 1310 and haptic device 1320 are shown as examples of wearable devices that include a flexible, wearable textile material 1330 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1340 may be positioned at least partially within one or more corresponding pockets formed in textile material 1330 of vibrotactile system 1300. Vibrotactile devices 1340 may be positioned in locations to provide a vibrating sensation (e.g., haptic feedback) to a user of vibrotactile system 1300. For example, vibrotactile devices 1340 may be positioned against the user's finger(s), thumb, or wrist, as shown in FIG. 13. Vibrotactile devices 1340 may, in some examples, be sufficiently flexible to conform to or bend with the user's corresponding body part(s).

A power source 1350 (e.g., a battery) for applying a voltage to the vibrotactile devices 1340 for activation thereof may be electrically coupled to vibrotactile devices 1340, such as via conductive wiring 1352. In some examples, each of vibrotactile devices 1340 may be independently electrically coupled to power source 1350 for individual activation. In some embodiments, a processor 1360 may be operatively coupled to power source 1350 and configured (e.g., programmed) to control activation of vibrotactile devices 1340.

Vibrotactile system 1300 may be implemented in a variety of ways. In some examples, vibrotactile system 1300 may be a standalone system with integral subsystems and components for operation independent of other devices and systems. As another example, vibrotactile system 1300 may be configured for interaction with another device or system 1370. For example, vibrotactile system 1300 may, in some examples, include a communications interface 1380 for receiving and/or sending signals to the other device or system 1370. The other device or system 1370 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1380 may enable communications between vibrotactile system 1300 and the other device or system 1370 via a wireless (e.g., Wi-Fi, BLUETOOTH, cellular, radio, etc.) link or a wired link. If present, communications interface 1380 may be in communication with processor 1360, such as to provide a signal to processor 1360 to activate or deactivate one or more of the vibrotactile devices 1340.

Vibrotactile system 1300 may optionally include other subsystems and components, such as touch-sensitive pads 1390, pressure sensors, motion sensors, position sensors, lighting elements, and/or user interface elements (e.g., an on/off button, a vibration control element, etc.). During use, vibrotactile devices 1340 may be configured to be activated for a variety of different reasons, such as in response to the user's interaction with user interface elements, a signal from the motion or position sensors, a signal from the touch-sensitive pads 1390, a signal from the pressure sensors, a signal from the other device or system 1370, etc.

Although power source 1350, processor 1360, and communications interface 1380 are illustrated in FIG. 13 as being positioned in haptic device 1320, the present disclosure is not so limited. For example, one or more of power source 1350, processor 1360, or communications interface 1380 may be positioned within haptic device 1310 or within another wearable textile.

Figure 14:
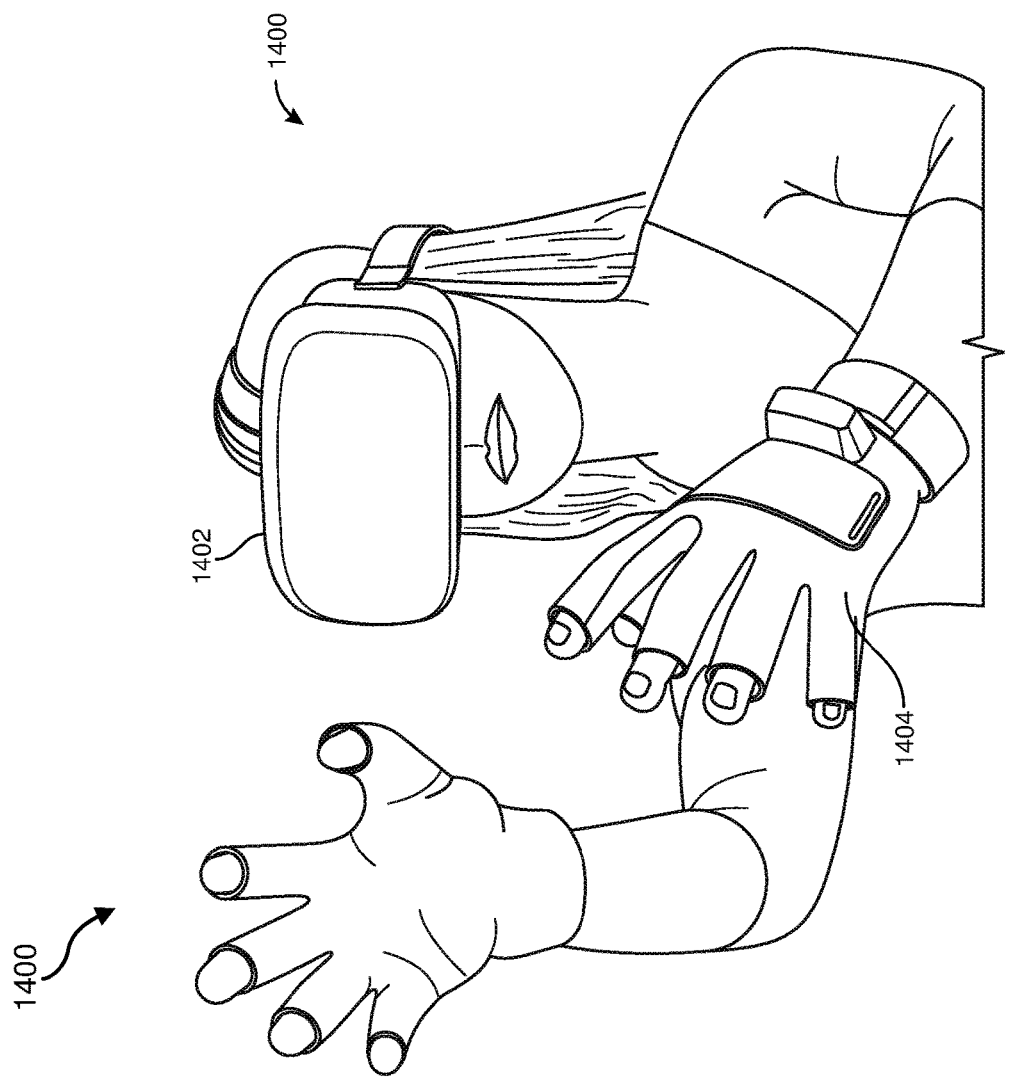
FIG. 14 is an illustration of an exemplary virtual-reality environment according to embodiments of this disclosure.

Haptic wearables, such as those shown in and described in connection with FIG. 13, may be implemented in a variety of types of artificial-reality systems and environments. FIG. 14 shows an example artificial-reality environment 1400 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 12:
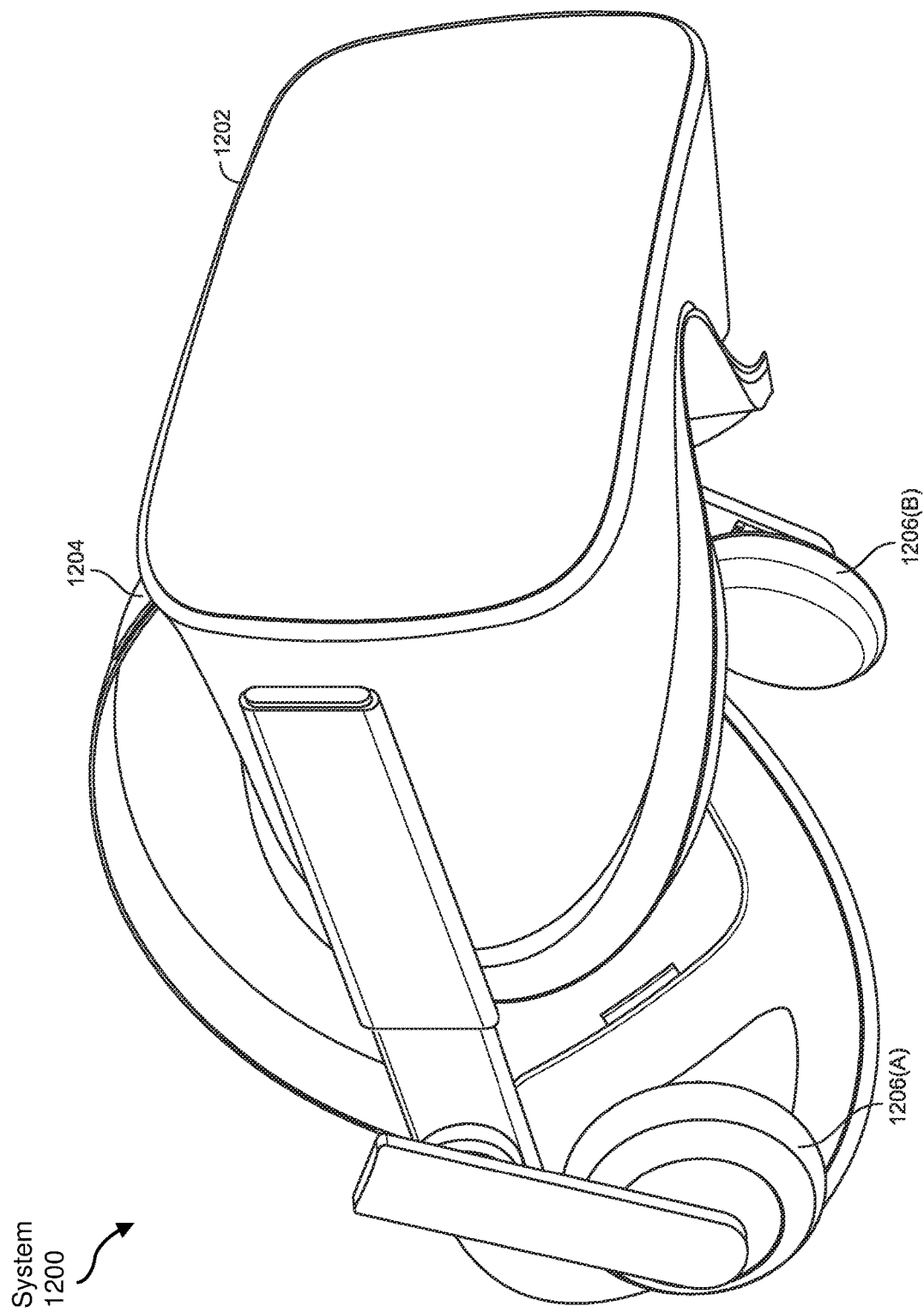
FIG. 12 is an illustration of an exemplary virtual-reality headset that may be used in connection with embodiments of this disclosure.

Head-mounted display 1402 generally represents any type or form of virtual-reality system, such as virtual-reality system 1200 in FIG. 12. Haptic device 1404 generally represents any type or form of wearable device, worn by a user of an artificial-reality system, that provides haptic feedback to the user to give the user the perception that he or she is physically engaging with a virtual object. In some embodiments, haptic device 1404 may provide haptic feedback by applying vibration, motion, and/or force to the user. For example, haptic device 1404 may limit or augment a user's movement. To give a specific example, haptic device 1404 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1404 to send action requests to a console. Examples of action requests include, without limitation, requests to start an application and/or end the application and/or requests to perform a particular action within the application.

Figure 15:
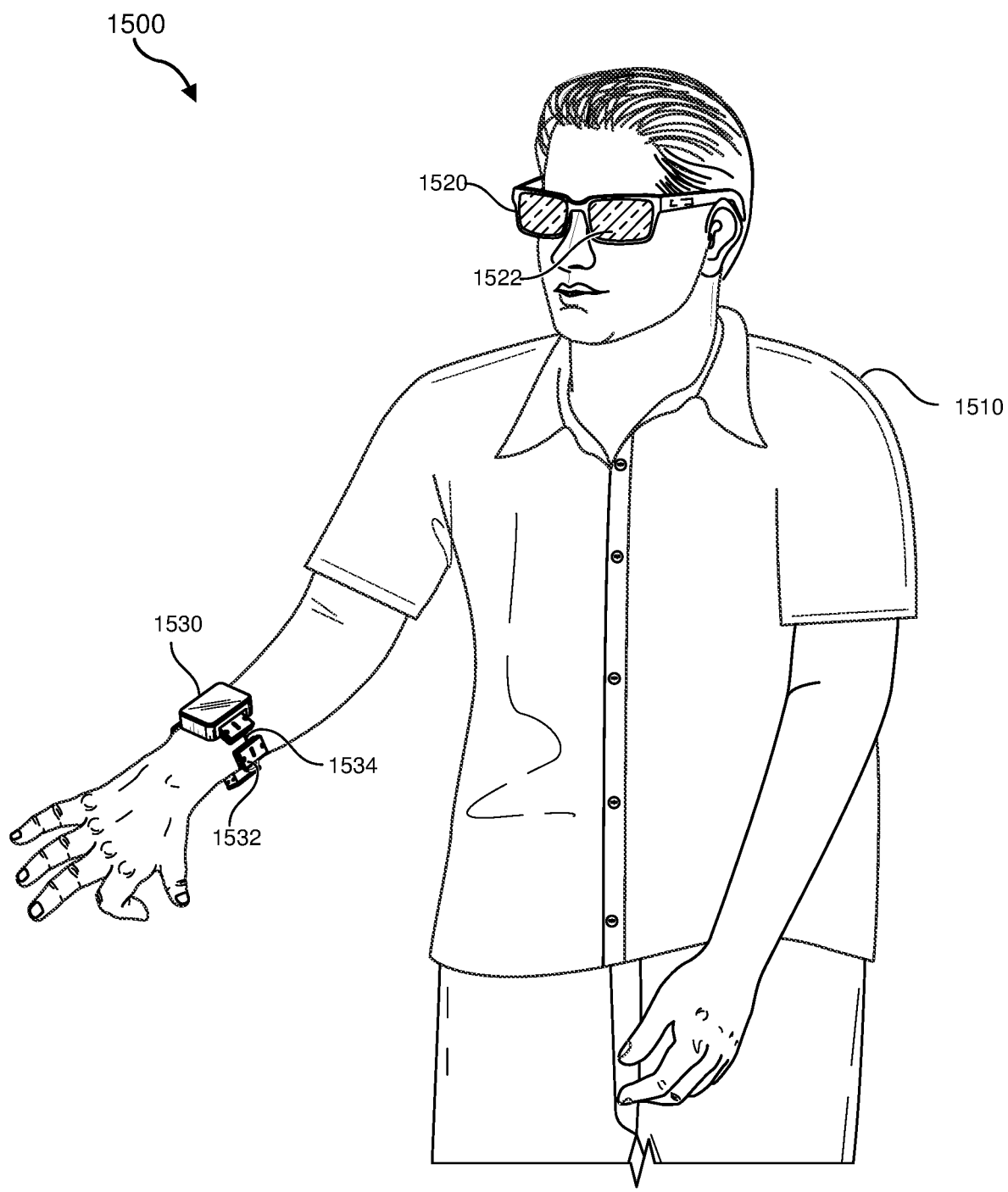
FIG. 15 is an illustration of an exemplary augmented-reality environment according to embodiments of this disclosure.

While haptic interfaces may be used with virtual-reality systems, as shown in FIG. 14, haptic interfaces may also be used with augmented-reality systems, as shown in FIG. 15. FIG. 15 is a perspective view of a user 1510 interacting with an augmented-reality system 1500. In this example, user 1510 may wear a pair of augmented-reality glasses 1520 that may have one or more displays 1522 and that are paired with a haptic device 1530. In this example, haptic device 1530 may be a wristband that includes a plurality of band elements 1532 and a tensioning mechanism 1534 that connects band elements 1532 to one another.

One or more of band elements 1532 may include any type or form of actuator suitable for providing haptic feedback. For example, one or more of band elements 1532 may be configured to provide one or more of various types of cutaneous feedback, including vibration, force, traction, texture, and/or temperature. To provide such feedback, band elements 1532 may include one or more of various types of actuators. In one example, each of band elements 1532 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1310, 1320, 1404, and 1530 may include any suitable number and/or type of haptic transducer, sensor, and/or feedback mechanism. For example, haptic devices 1310, 1320, 1404, and 1530 may include one or more mechanical transducers, piezoelectric transducers, and/or fluidic transducers. Haptic devices 1310, 1320, 1404, and 1530 may also include various combinations of different types and forms of transducers that work together or independently to enhance a user's artificial-reality experience. In one example, each of band elements 1532 of haptic device 1530 may include a vibrotactor (e.g., a vibrotactile actuator) configured to vibrate in unison or independently to provide one or more of various types of haptic sensations to a user.

FIG. 16 illustrates an exemplary human-machine interface (also referred to herein as an EMG control interface) configured to be worn around a user's lower arm or wrist as a wearable system 1600. In this example, wearable system 1600 may include sixteen neuromuscular sensors 1610 (e.g., EMG sensors) arranged circumferentially around an elastic band 1620 with an interior surface 930 configured to contact a user's skin. However, any suitable number of neuromuscular sensors may be used. The number and arrangement of neuromuscular sensors may depend on the particular application for which the wearable device is used. For example, a wearable armband or wristband can be used to generate control information for controlling an augmented reality system, a robot, controlling a vehicle, scrolling through text, controlling a virtual avatar, or any other suitable control task. As shown, the sensors may be coupled together using flexible electronics incorporated into the wireless device. In some embodiments, the output of one or more of the sensing components can be optionally processed using hardware signal processing circuitry (e.g., to perform amplification, filtering, and/or rectification). In other embodiments, at least some signal processing of the output of the sensing components can be performed in software. Thus, signal processing of signals sampled by the sensors can be performed in hardware, software, or by any suitable combination of hardware and software, as aspects of the technology described herein are not limited in this respect. A non-limiting example of a signal processing chain used to process recorded data from sensors 1610 is discussed in more detail below with reference to FIG. 17.

Figure 17:
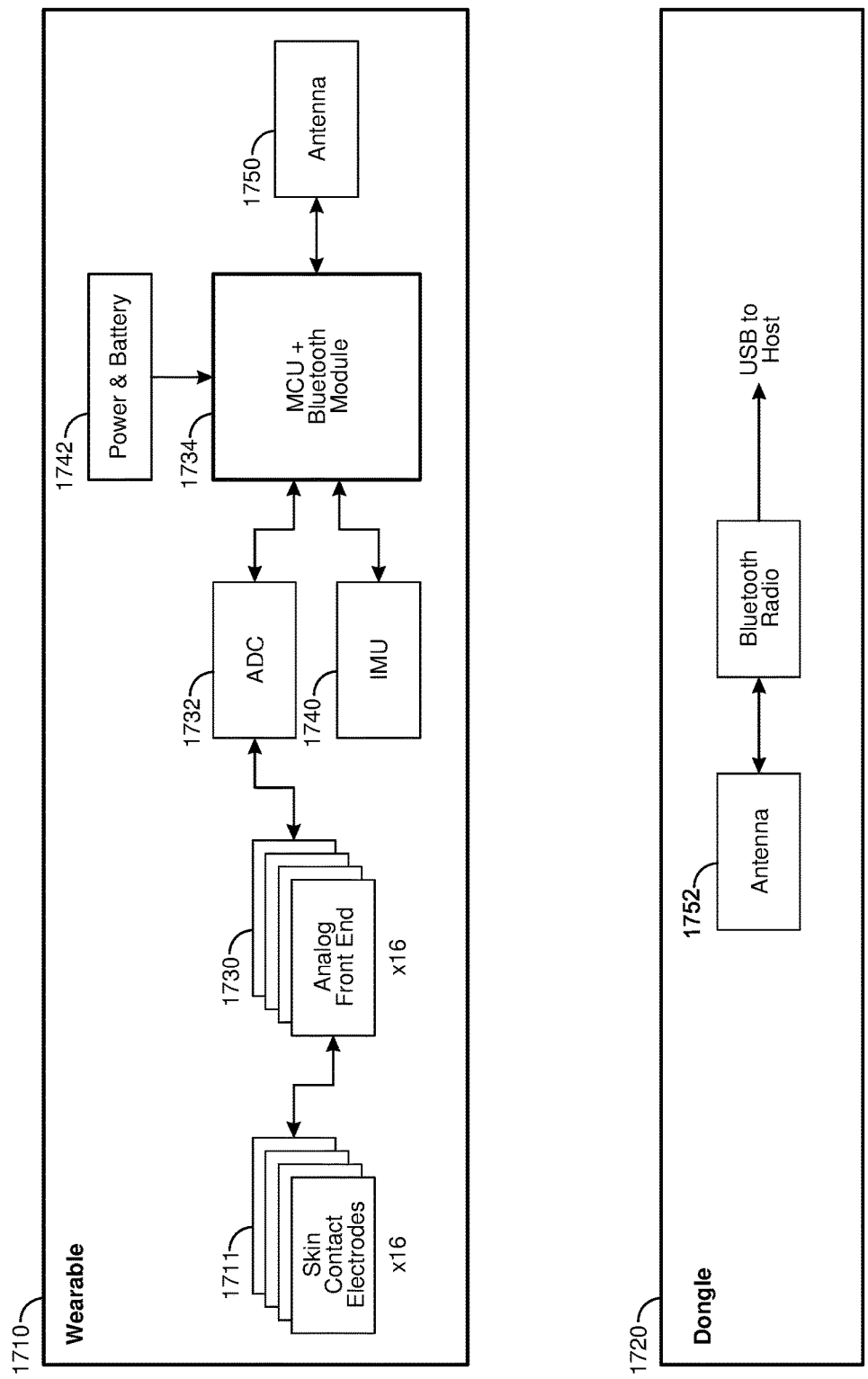
FIG. 17 is an illustration of an exemplary schematic diagram with internal components of a wearable system.

FIG. 17 illustrate an exemplary schematic diagram with internal components of a wearable system with EMG sensors. As shown, the wearable system may include a wearable portion 1710 and a dongle portion 1720 in communication with the wearable portion 1710 (e.g., via BLUETOOTH or another suitable wireless communication technology). As shown in FIG. 17, the wearable portion 1710 may include skin contact electrodes 1711, examples of which are described in connection with FIG. 16. The output of the skin contact electrodes 1711 may be provided to analog front end 1730, which may be configured to perform analog processing (e.g., amplification, noise reduction, filtering, etc.) on the recorded signals. The processed analog signals may then be provided to analog-to-digital converter 1732, which may convert the analog signals to digital signals that can be processed by one or more computer processors. An example of a computer processor that may be used in accordance with some embodiments is microcontroller (MCU) 1734. As shown, MCU 1734 may also include inputs from other sensors (e.g., IMU sensor 1740), and power and battery module 1742. The output of the processing performed by MCU 1734 may be provided to antenna 1750 for transmission to dongle portion 1720.

Dongle portion 1720 may include antenna 1752, which may be configured to communicate with antenna 1750 included as part of wearable portion 1710. Communication between antennas 1750 and 1752 may occur using any suitable wireless technology and protocol, non-limiting examples of which include radiofrequency signaling and BLUETOOTH. As shown, the signals received by antenna 1752 of dongle portion 1720 may be provided to a host computer for further processing, display, and/or for effecting control of a particular physical or virtual object or objects.

Although the examples provided with reference to FIG. 16 and FIG. 17 are discussed in the context of interfaces with EMG sensors, the techniques described herein for reducing electromagnetic interference can also be implemented in wearable interfaces with other types of sensors including, but not limited to, mechanomyography (MMG) sensors, sonomyography (SMG) sensors, and electrical impedance tomography (EIT) sensors. The techniques described herein for reducing electromagnetic interference can also be implemented in wearable interfaces that communicate with computer hosts through wires and cables (e.g., USB cables, optical fiber cables, etc.).

In some embodiments, one or more objects (e.g., data associated with sensors, and/or activity information) of a computing system may be associated with one or more privacy settings. These objects may be stored on or otherwise associated with any suitable computing system or application, such as, for example, a social-networking system, a client system, a third-party system, a messaging application, a photo-sharing application, a biometric data acquisition application, an artificial-reality application, and/or any other suitable computing system or application.

Privacy settings (or "access settings") for an object may be stored in any suitable manner, such as, for example, in association with the object, in an index on an authorization server, in another suitable manner, or any suitable combination thereof. A privacy setting for an object may specify how the object (or particular information associated with the object) can be accessed, stored, or otherwise used (e.g., viewed, shared, modified, copied, executed, surfaced, or identified) within an application (such as an artificial-reality application). When privacy settings for an object allow a particular user or other entity to access that object, the object may be described as being "visible" with respect to that user or other entity. As an example, a user of an artificial-reality application may specify privacy settings for a user-profile page that identify a set of users that may access the artificial-reality application information on the user-profile page, thus excluding other users from accessing that information. As another example, an artificial-reality application may store privacy policies/guidelines. The privacy policies/guidelines may specify what information of users may be accessible by which entities and/or by which processes (e.g., internal research, advertising algorithms, machine-learning algorithms), thus ensuring only certain information of the user may be accessed by certain entities or processes.

In some embodiments, privacy settings for an object may specify a "blocked list" of users or other entities that should not be allowed to access certain information associated with the object. In some cases, the blocked list may include third-party entities. The blocked list may specify one or more users or entities for which an object is not visible.

Privacy settings associated with an object may specify any suitable granularity of permitted access or denial of access. As an example, access or denial of access may be specified for particular users (e.g., only me, my roommates, my boss), users within a particular degree-of-separation (e.g., friends, friends-of-friends), user groups (e.g., the gaming club, my family), user networks (e.g., employees of particular employers, students or alumni of particular university), all users ("public"), no users ("private"), users of third-party systems, particular applications (e.g., third-party applications, external websites), other suitable entities, or any suitable combination thereof. In some embodiments, different objects of the same type associated with a user may have different privacy settings. In addition, one or more default privacy settings may be set for each object of a particular object-type.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to any claims appended hereto and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Finally, for ease of use, the terms "including" and "having" (and their derivatives), as used in the specification and/or claims, are interchangeable with and have the same meaning as the word "comprising."

What is claimed is:

1. A high-voltage optical transformer comprising:
an array of light-emitting devices that:
are connected in parallel with one another; and
are electrically coupled to an electrical input;
a transfer medium; and
an array of photovoltaic cells that:
are optically coupled to the array of light-emitting devices via the transfer medium;
are connected in series with one another; and
produce an electrical output whose voltage is higher than the electrical input.

2. The high-voltage optical transformer of claim 1, wherein:
each photovoltaic cell included in the array of photovoltaic cells is optically coupled to a single light-emitting device included in the array of light-emitting devices; and
each light-emitting device included in the array of light-emitting devices is optically coupled to a single photovoltaic cell included in the array of photovoltaic cells.

3. The high-voltage optical transformer of claim 1, wherein the transfer medium is bonded between the array of light-emitting devices and the array of photovoltaic cells.

4. The high-voltage optical transformer of claim 3, further comprising a heatsink that is thermally coupled to the array of light-emitting devices opposite the transfer medium such that the array of light-emitting devices resides between the heatsink and the transfer medium.

5. The high-voltage optical transformer of claim 1, wherein the transfer medium comprises:
at least one conductor that electrically couples a power source to the array of light-emitting devices; and
at least one additional conductor that electrically couples the electrical output produced by the array of photovoltaic cells to a power-consuming device.

6. The high-voltage optical transformer of claim 5, wherein:
the conductor of the transfer medium forms an electrical connection to the power source at a surface facing the array of light-emitting devices; and
the additional conductor of the transfer medium forms an additional electrical connection to the power-consuming device at the surface facing the array of light-emitting devices.

7. The high-voltage optical transformer of claim 6, wherein the conductor of the transfer medium comprises:
a first segment that extends from the electrical connection at the surface facing the array of light-emitting devices through the transfer medium to an additional surface facing the array of photovoltaic cells;
a second segment that extends along the additional surface facing the array of photovoltaic cells toward the additional conductor of the transfer medium; and
a third segment that extends from the additional surface facing the array of photovoltaic cells through the transfer medium to the surface facing the array of light-emitting devices.

8. The high-voltage optical transformer of claim 7, wherein the additional conductor of the transfer medium extends from the additional surface facing the array of photovoltaic cells to the additional electrical connection at the surface facing the array of light-emitting devices.

9. The high-voltage optical transformer of claim 1, wherein:
the array of light-emitting devices are laterally arranged on a low-voltage die;
the array of photovoltaic cells are laterally arranged on a high-voltage die; and
the transfer medium electrically isolates the low-voltage die and the high-voltage die from one another.

10. The high-voltage optical transformer of claim 9, wherein the low-voltage die, the transfer medium, and the high-voltage die are potted in an opaque non-conductive material.

11. The high-voltage optical transformer of claim 9, wherein the low-voltage die is aligned relative to the high-voltage die atop the transfer medium according to one or more fiducial markers.

12. The high-voltage optical transformer of claim 1, wherein the transfer medium comprises at least one of:
a vacuum;
a dielectric material;
a glass;
a non-conductive fluid;
a polymeric material; or
an epoxy.

13. The high-voltage optical transformer of claim 1, wherein the transfer medium is optically transparent to support a transfer of electromagnetic radiation from the array of light-emitting devices to the array of photovoltaic cells.

14. The high-voltage optical transformer of claim 13, wherein the transfer medium supports the transfer of electromagnetic radiation within a visible light spectrum ranging between 380 nanometers and 750 nanometers.

15. The high-voltage optical transformer of claim 1, wherein the transfer medium includes a conduit that facilitates circulation of a dielectric fluid through which electromagnetic radiation generated by the array of light-emitting devices passes via the optical coupling.

16. An artificial-reality system comprising:
a head-mounted display; and
a high-voltage optical transformer incorporated into the head-mounted display, wherein the high-voltage optical transformer comprises:
an array of light-emitting devices that:
are connected in parallel with one another; and
are electrically coupled to an electrical input;
a transfer medium; and
an array of photovoltaic cells that:
are optically coupled to the array of light-emitting devices via the transfer medium;
are connected in series with one another; and
produce an electrical output whose voltage is higher than the electrical input.

17. The artificial-reality system of claim 16, further comprising:
a liquid lens device that:
is incorporated into the head-mounted display;
is powered by the electrical output produced by the array of photovoltaic cells; and
includes a diopter; and
wherein the transfer medium of the high-voltage optical transformer comprises a non-conductive oil that facilitates changing the diopter included in the liquid lens device.

18. The artificial-reality system of claim 17, wherein:
the transfer medium comprises a fluid; and
the high-voltage optical transformer is submerged in the fluid such that the fluid serves to:
cool the high-voltage optical transformer; and
optically couple the array of light-emitting devices to the array of photovoltaic cells.

19. The artificial-reality system of claim 17, further comprising a coolant fluid incorporated into the head-mounted display, wherein the coolant fluid:
- flows between the array of light-emitting devices and the array of photovoltaic cells to facilitate cooling the high-voltage optical transformer;
- encompasses the high-voltage optical transformer to facilitate cooling the high-voltage optical transformer; or
- flows across at least one additional component of the head-mounted display to facilitate cooling the additional component of the head-mounted display.

20. A method comprising:
- manufacturing a low-voltage die that includes an array of light-emitting devices that are connected in parallel with one another and are configured to be powered via an electrical input;
- manufacturing a high-voltage die that includes an array of photovoltaic cells that are connected in series with one another and are configured to produce an electrical output whose voltage is higher than the electrical input; and
- forming a high-voltage optical transformer with the low-voltage die and the high-voltage die by:
  - bonding a transfer medium between the low-voltage die and the high-voltage die; and
  - optically coupling the array of light-emitting devices to the array of photovoltaic cells via the transfer medium.

\* \* \* \* \*